(12) United States Patent
Oike

(10) Patent No.: US 10,700,082 B2
(45) Date of Patent: Jun. 30, 2020

(54) SEMICONDUCTOR STORAGE DEVICE

(71) Applicant: Toshiba Memory Corporation, Tokyo (JP)

(72) Inventor: Go Oike, Mie Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/286,207

(22) Filed: Feb. 26, 2019

(65) Prior Publication Data

US 2020/0075618 A1    Mar. 5, 2020

(30) Foreign Application Priority Data

Aug. 30, 2018   (JP) .................................. 2018-162067

(51) Int. Cl.

| | | |
|---|---|---|
| *H01L 27/11575* | (2017.01) | |
| *H01L 27/11519* | (2017.01) | |
| *H01L 27/11565* | (2017.01) | |
| *H01L 27/11582* | (2017.01) | |
| *H01L 21/768* | (2006.01) | |
| *H01L 27/11556* | (2017.01) | |
| *H01L 23/522* | (2006.01) | |
| *H01L 27/11548* | (2017.01) | |

(52) U.S. Cl.
CPC .. *H01L 27/11575* (2013.01); *H01L 21/76805* (2013.01); *H01L 21/76816* (2013.01); *H01L 21/76831* (2013.01); *H01L 23/5226* (2013.01); *H01L 27/11519* (2013.01); *H01L 27/11548* (2013.01); *H01L 27/11556* (2013.01); *H01L 27/11565* (2013.01); *H01L 27/11582* (2013.01)

(58) Field of Classification Search
CPC ......... H01L 27/11548; H01L 27/11575; H01L 27/115; H01L 29/792; H01L 27/11568; H01L 27/11526; H01L 27/11556; H01L 27/11565

USPC ........ 257/316, 324, 326, 331; 438/216, 261, 438/591, 593
See application file for complete search history.

(56) References Cited

U.S. PATENT DOCUMENTS

| | | |
|---|---|---|
| 9,431,419 B2 | 8/2016 | Fukuzumi et al. |
| 9,960,173 B2 | 5/2018 | Shimojo |
| 2016/0056171 A1* | 2/2016 | Manorotkul et al. ...................... H01L 27/11582 257/66 |

FOREIGN PATENT DOCUMENTS

JP    2017-163057 A    9/2017

* cited by examiner

*Primary Examiner* — Thinh T Nguyen
(74) *Attorney, Agent, or Firm* — Kim & Stewart LLP

(57) ABSTRACT

A semiconductor storage device includes a base body, a stacked body, a plurality of columns, and a plurality of first contacts. The base body includes a substrate, a semiconductor element on the substrate, a lower wiring layer above the semiconductor element in a thickness direction of the base body and connected to the semiconductor element, and a lower conductive layer above the lower wiring layer in the thickness direction. The stacked body is above the lower conductive layer and including an alternating stack of conductive layers and insulating layers. Each of the columns includes a semiconductor body extending through the stacked body and electrically connected to the lower conductive layer. The plurality of first contacts extend through the stacked body and electrically connected to the lower conductive layer. The lower conductive layer is separately provided under each of the plurality of first contacts.

20 Claims, 16 Drawing Sheets

SEMICONDUCTOR STORAGE DEVICE

CROSS-REFERENCE TO RELATED APPLICATION

This application is based upon and claims the benefit of priority from Japanese Patent Application No. 2018-162067, filed on Aug. 30, 2018, the entire contents of which are incorporated herein by reference.

FIELD

Embodiments described herein relate generally to a semiconductor storage device.

BACKGROUND

A nonvolatile memory having a stacked body in which insulating films and conductive films are alternately stacked as a memory cell array of a three-dimensional structure stacked in a height direction of the stacked body is being developed. Such a memory cell of the nonvolatile memory is provided between the stacked body and a columnar portion extending in a stack direction. A plurality of memory cells provided along the columnar portion are electrically connected in series and configure a memory string.

A tap region is provided for transferring a source voltage, a signal, a power source voltage, and the like to the memory cell, between cell regions of such a memory cell array. A contact plug in the tap region penetrates the stacked body and is connected to a source layer or a lower layer wiring under the source layer. For example, the contact plug connected to the lower layer wiring is adjacent to the source layer through an oxide film provided on an inner wall of a contact hole, and is connected to the lower layer wiring in a state in which the contact plug is electrically separated from the source layer by the oxide film.

The source layer may be provided entirely under the memory cell array in order to provide a source potential to the memory string. According to such a configuration, in a case where the oxide film is broken and current leakage occurs between the contact plug and the source layer, there may be a danger of irreparable failure of the whole device.

DETAILED DESCRIPTION

Figure 1:
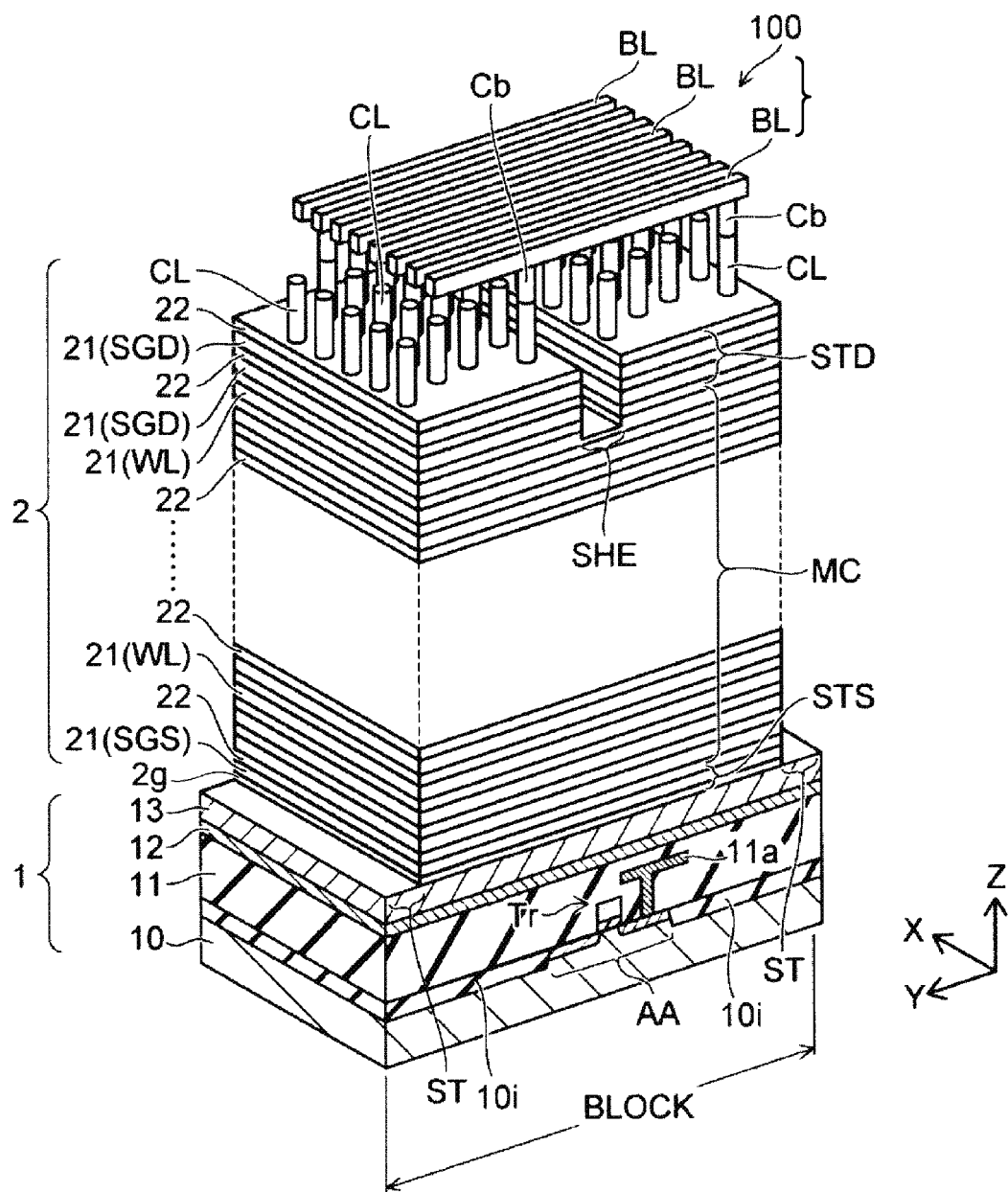
FIG. 1 illustrates a schematic perspective view of a semiconductor storage device according to a first embodiment.

An embodiment provides a semiconductor storage device capable of preventing current leakage between a contact plug and a source layer.

In general, according to an embodiment, a semiconductor storage device includes abase body, a stacked body, a plurality of columns, and a plurality of first contacts. The base body includes a substrate, a semiconductor element on the substrate, a lower wiring layer above the semiconductor element in a thickness direction of the base body and connected to the semiconductor element, and a lower conductive layer above the lower wiring layer in the thickness direction. The stacked body is above the lower conductive layer and including an alternating stack of conductive layers and insulating layers. Each of the columns includes a semiconductor body extending through the stacked body and electrically connected to the lower conductive layer. The plurality of first contacts extend through the stacked body and electrically connected to the lower conductive layer. The lower conductive layer is separately provided under each of the plurality of first contacts.

Hereinafter, embodiments according to the present disclosure will be described with reference to the drawings. The present embodiment does not limit the present disclosure. In the following embodiments, a vertical direction of a semiconductor substrate indicates a relative direction in a case where a surface on which a semiconductor element is provided is upward and may be different from a vertical direction according to a gravitational acceleration in some cases. The drawings are schematic or conceptual, and a ratio or the like of each portion is not necessarily the same as an actual one. In the specification and drawings, elements similar to those described above with reference to the drawings are described with the same reference numerals, and the detailed description thereof will be omitted as appropriate.

First Embodiment

FIG. 1 illustrates a schematic perspective view of a semiconductor storage device 100 according to the first embodiment. In addition, a stack direction of a stacked body 2 is set as a Z-axis direction. One direction intersecting (for example, orthogonal to) the Z-axis direction is set as a first direction. The first direction is, for example, a Y-axis direction. One direction intersecting (for example, orthogonal to) each of the Z and Y-axis directions is set as a second direction. The second direction is, for example, an X-axis direction.

The semiconductor storage device 100 according to the first embodiment is a nonvolatile memory having a memory cell of a three-dimensional structure. As shown in FIG. 1, the semiconductor storage device 100 includes a base body portion 1, the stacked body 2, a plurality of first columnar portions CL, and a plurality of bit lines BL.

The base body portion 1 includes a substrate 10, a first insulating film 11, and first conductive layers 12 and 13. The first insulating film 11 is provided on the substrate 10. The first conductive layers 12 and 13 include a lower conductive layer 12 and an upper conductive layer 13. The lower conductive layer 12 is provided on the first insulating film 11. The upper conductive layer 13 is provided on the lower conductive layer 12. The substrate 10 is a semiconductor substrate, for example, a silicon substrate. A conductivity type of silicon (Si) is, for example, p-type. In a surface region of the substrate 10, for example, an element isolation area 10$i$ is provided. The element isolation area 10$i$ is, for example, an insulating area including silicon oxide, and defines an active area AA in the surface region of the substrate 10. On the substrate 10 in the active area AA, a semiconductor element is provided. The semiconductor element is, for example, a transistor Tr. Source and drain regions of the transistor Tr are provided in the active area AA. The transistor Tr configures a peripheral circuit of the nonvolatile memory. The first insulating film 11 includes, for example, silicon oxide ($SiO_2$), and covers and protects the transistor Tr. In the first insulating film 11, a lower layer wiring 11$a$ is provided. The lower layer wiring 11$a$ is electrically connected to the semiconductor element such as the transistor Tr.

In the present embodiment, the first conductive layers 12 and 13 are stacked films including a lower conductive layer 12 and an upper conductive layer 13. The lower conductive layer 12 includes a conductive metal (for example, tungsten) or a metal silicide (for example, tungsten silicide (WSi)). The upper conductive layer 13 includes, for example, n-type doped polysilicon. A part of the upper conductive layer 13 may be undoped polysilicon. The first conductive layers 12 and 13 are connected to the first columnar portion CL and function as a common source line (buried source line (BSL)).

The stacked body 2 is positioned over (in the Z-axis direction) the first conductive layers 12 and 13. The stacked body 2 includes a plurality of second conductive layers 21 and a plurality of insulating layers 22. The plurality of second conductive layers 21 and the plurality of insulating layers 22 are alternately stacked along the Z-axis direction. The second conductive layer 21 includes a conductive metal, for example, tungsten. The insulating layer 22 includes, for example, silicon oxide. The insulating layers 22 are provided between the plurality of adjacent conductive layers 21 in the Z direction and insulate the conductive layers 21. The number of the stacked second conductive layer 21 and the number of the stacked insulating layer 22 may be any numbers. The insulating layer 22 may be, for example, a cavity (gap).

For example, an insulating film 2$g$ is provided between the stacked body 2 and the upper conductive layer 13. The insulating film 2$g$ may be, for example, silicon oxide ($SiO_2$). The insulating film 2$g$ may include a high dielectric having a relative dielectric constant higher than that of silicon oxide. The high dielectric is, for example, a metal oxide.

The second conductive layer 21 includes at least one source-side selection gate SGS, a plurality of word lines WL, and at least one drain-side selection gate SGD. The source-side selection gate SGS is a gate electrode of a source-side select transistor STS. A word line WL is a gate electrode of a memory cell MC. A drain-side selection gate SGD is a gate electrode of a drain-side select transistor STD. The source-side selection gate SGS is provided in a lower region of the stacked body 2. The drain-side selection gate SGD is provided in an upper region of the stacked body 2. The lower region refers to a region of the stacked body 2 on a side closer to the base body portion 1 and the upper region refers to a region of the stacked body 2 on a side farther from the base body portion 1. The word line WL is provided between the source-side selection gate SGS and the drain-side selection gate SGD.

Among the plurality of insulating layers 22, the thickness in the Z-axis direction of the insulating layer 22 that insulates the source-side selection gate SGS from the word line WL may be thicker than, for example, a thickness in the Z-axis direction of an insulating layer 22 that insulates a word line WL from another word line WL. Furthermore, a cover insulating film (not shown) may be provided on the uppermost insulating layer 22. The cover insulating film includes, for example, silicon oxide.

The semiconductor storage device 100 has a plurality of memory cells MC connected in series between the source-side select transistor STS and the drain-side select transistor STD. A structure in which the source-side select transistor STS, the memory cell MC, and the drain-side select transistor STD are connected in series is referred to as a "memory string" or a "NAND string". For example, the memory string is connected to the bit line BL through a contact Cb. The bit line BL is provided over the stacked body 2 and extends in the Y-axis direction.

Figure 2:
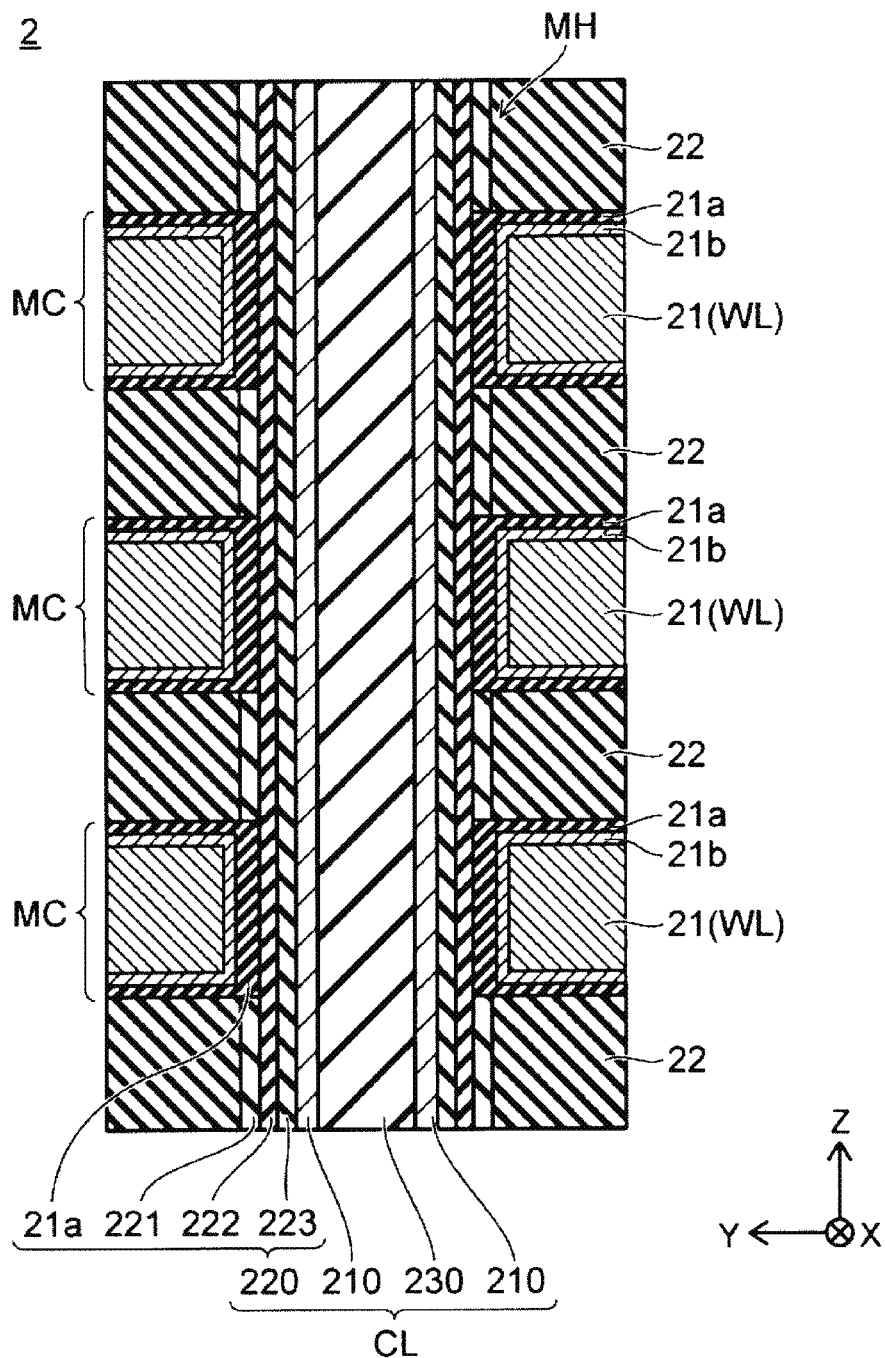
FIG. 2 illustrates a schematic cross-sectional view of a first columnar portion.
Figure 3:
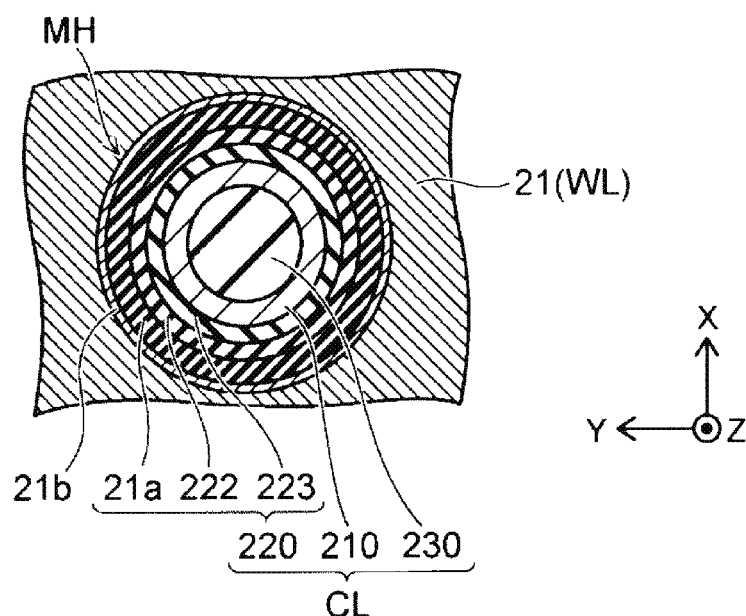
FIG. 3 illustrates a schematic plan view of the first columnar portion.
Figure 5:
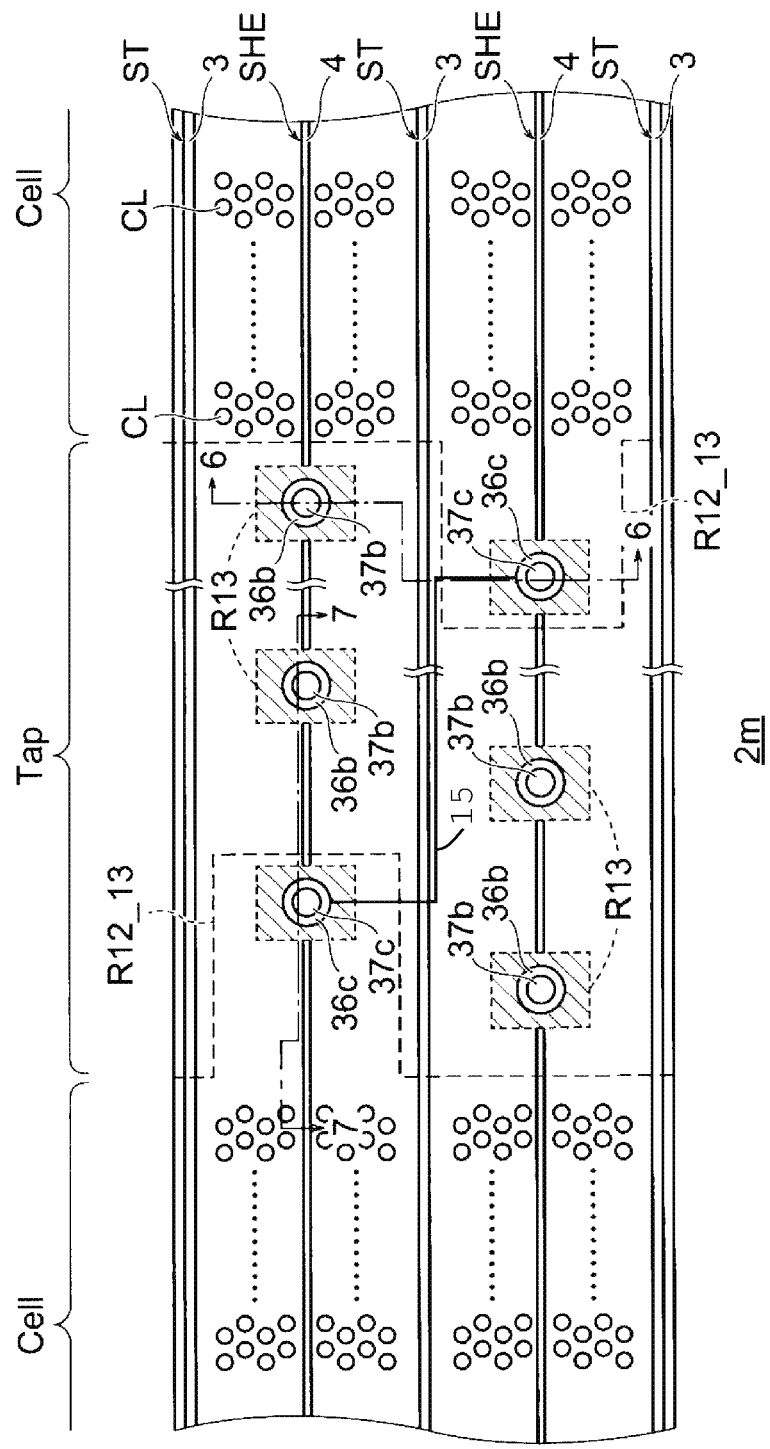
FIG. 5 illustrates a schematic plan view of the semiconductor device according to the first embodiment.

FIG. 2 illustrates a schematic cross-sectional view of the first columnar portion CL. FIG. 3 illustrates a schematic plan view of the first columnar portion CL. A memory hole MH penetrates the stacked body 2 from an upper end of the stacked body 2 along the Z-axis direction and is provided in the stacked body 2 and the upper layer conductive layer 13. Each of the plurality of first columnar portions CL includes a semiconductor body 210, a memory film 220, and a core layer 230. The semiconductor body 210 is electrically connected to the upper conductive layer 13. The memory film 220 has a charge trapping portion between the semiconductor body 210 and the conductive layer 21. All of the plurality of first columnar portions CL selected one by one from each finger are jointly connected to one bit line BL through the contact Cb of FIG. 1. As shown in FIG. 5, each of the first columnar portions CL is provided, for example, in a cell region (Cell).

As shown in FIGS. 2 and 3, a shape of the memory hole MH in an X-Y plane is, for example, a circle or an ellipse. A block insulating film 21$a$ configuring a part of the memory film 220 may be provided between the second conductive layer 21 and the insulating layer 22. The block insulating film 21$a$ is, for example, a silicon oxide film or a metal oxide film. One example of the metal oxide is aluminum oxide. A barrier film 21$b$ may be provided between the second conductive layer 21 and the insulating layer 22 and between the second conductive layer 21 and the memory film 220. When the conductive layer 21 is tungsten, for example, a stacked structure film of titanium nitride and titanium is selected as the barrier film 21b. The block insulating film 21a prevents back tunneling of charges from the conductive layer 21 to the memory film 220. The barrier film 21b improves adhesion between the conductive layer 21 and the block insulating film 21a.

A shape of the semiconductor body 210 is, for example, a cylindrical shape having a bottom. The semiconductor body 210 includes, for example, silicon. The silicon is, for example, polysilicon in which amorphous silicon is crystallized. The semiconductor body 210 is, for example, undoped polysilicon. In addition, the semiconductor body 210 may be p-type silicon. The semiconductor body 210 is a channel of each of the drain-side select transistor STD, the memory cell MC, and the source-side select transistor STS.

A portion of the memory film 220 other than the block insulating film 21a is provided between the inner wall of the memory hole MH and the semiconductor body 210. A shape of the memory film 220 is, for example, cylindrical. The plurality of memory cells MC have a storage region between the semiconductor body 210 and the second conductive layer 21 which serves as the word line WL, and are stacked in the Z-axis direction. The memory film 220 includes, for example, a cover insulating film 221, a charge trapping film 222, and a tunnel insulating film 223. Each of the semiconductor body 210, the charge trapping film 222, and the tunnel insulating film 223 extends in the Z-axis direction.

The cover insulating film 221 is provided between the insulating layer 22 and the charge trapping film 222. The cover insulating film 221 includes, for example, silicon oxide. The cover insulating film 221 protects the charge trapping film 222 from being etched when replacing a sacrifice film (not shown) on the conductive layer 21 (replace step). The cover insulating film 221 may be removed from between the second conductive layer 21 and the memory film 220 in the replace step. In this case, as shown in FIGS. 2 and 3, for example, the block insulating film 21a is provided between the second conductive layer 21 and the charge trapping film 222. In addition, when the replace step is not used for forming the second conductive layer 21, the cover insulating film 221 may be omitted.

The charge trapping film 222 is provided between the block insulating film 21a and the tunnel insulating film 223 and between the cover insulating film 221 and the tunnel insulating film 223. The charge trapping film 222 includes, for example, silicon nitride, and has a trapping site for trapping charges in the film. A portion of the charge trapping film 222 sandwiched between the conductive layer 21 which serves as the word line WL and the semiconductor body 210 configures the storage region of the memory cell MC which requires a charge trapping portion. The threshold voltage of the memory cell MC varies according to a presence or absence of charges in the charge trapping portion or the amount of charges trapped in the charge trapping portion. Therefore, the memory cell MC is able to store information. In addition, the charge trapping film 222 may be a floating gate structure in which a conductive material surrounded by an insulating material is used between one conductive layer 21 and the semiconductor body 210.

The tunnel insulating film 223 is provided between the semiconductor body 210 and the charge trapping film 222. The tunnel insulating film 223 includes, for example, silicon oxide or silicon oxide and silicon nitride. The tunnel insulating film 223 is a potential barrier between the semiconductor body 210 and the charge trapping film 222. For example, when electrons are injected from the semiconductor body 210 to the charge trapping portion (writing operation) and when holes are injected from the semiconductor body 210 to the charge trapping portion (erasing operation), both the electrons and holes pass through (tunneling) the potential barrier of the tunnel insulating film 223.

The core layer 230 fills an internal space of the semiconductor body 210 of a cylindrical shape. A shape of the core layer 230 is, for example, a columnar shape. The core layer 230 includes, for example, silicon oxide and is insulating.

Figure 4:
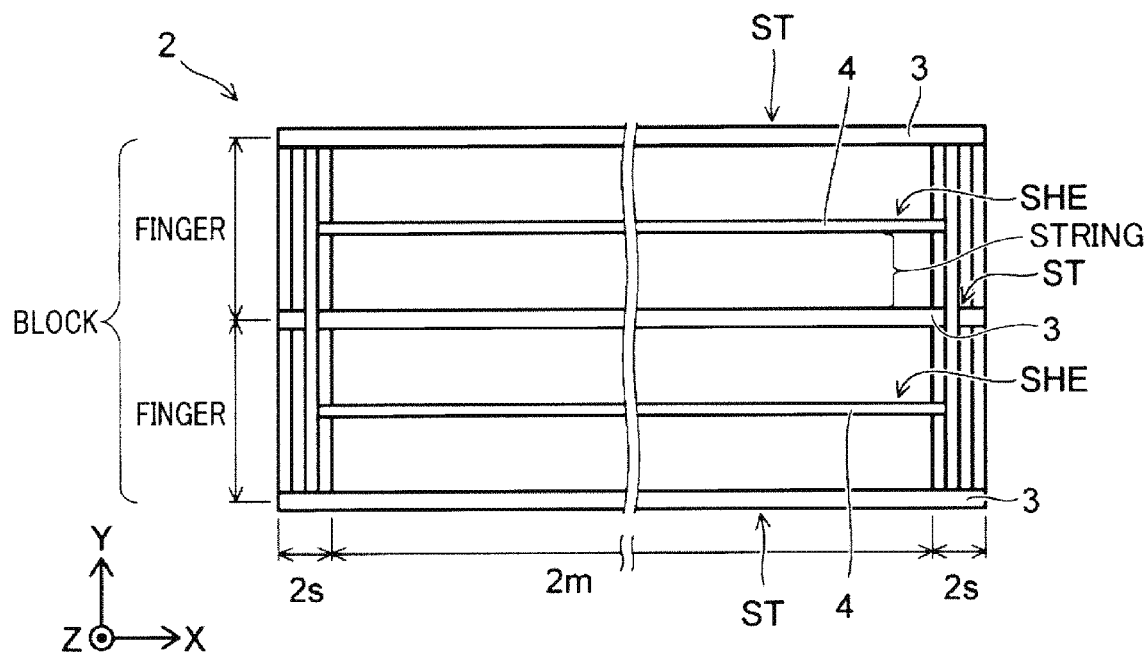
FIG. 4 illustrates a schematic plan view of a semiconductor device according to the first embodiment.

FIGS. 4 and 5 illustrate schematic plan views of a semiconductor device according to the first embodiment. As shown in FIG. 4, in the stacked body 2, each of a plurality of deep slits ST and a plurality of shallow slits SHE are provided. The deep slit ST extends in the X-axis direction within the stacked body 2 and penetrates the stacked body 2 from the upper end of the stacked body 2 to the base body portion 1. A plate shape portion 3 is provided in the deep slit ST. For example, silicon oxide is used for the plate shape portion 3. The plate shape portion 3 may include a conductive material (not shown) electrically connected to the upper conductive layer 13 that is electrically insulated from the stacked body 2. Similarly to the deep slit ST, the shallow slit SHE extends in the X-axis direction and is provided from the upper end of the stacked body 2 to a middle of the stacked body 2. In the shallow slit SHE, for example, an insulator 4 is provided. The insulator 4 is, for example, silicon oxide.

The stacked body 2 includes step portions 2s and a memory cell array 2m. The step portions 2s are provided at the edge portions of the stacked body 2. The memory cell array 2m is sandwiched or surrounded by the step portions 2s. The deep slit ST is provided from the step portion 2s at one end of the stacked body 2 to the step portion 2s at the other end of the stacked body 2 through the memory cell array 2m. The shallow slit SHE is provided in at least the memory cell array 2m. A contact plug (not shown) connected to each of the second conductive layers 21 (word lines WL) is provided in the step portion 2s. In addition, in and after FIG. 6, the shallow slit SHE is not shown.

A portion of the stacked body 2 sandwiched between two plate shape portions 3 of FIG. 4 is referred to as a finger. Two adjacent fingers configure a block. The block is a unit of a memory cell array sharing one word line, and, for example, configures a minimum unit of data erasure. The insulator 4 is provided in the finger. The stacked body 2 between the plate shape portion 3 and the insulator 4 (between ST and SHE) is referred to as a string. The drain-side selection gate SGD is sectioned for each string. Therefore, at the time of data writing and reading, it is possible to select one string in the block with a drain-side selection gate SGD. Each of the plurality of first columnar portions CL is provided in the memory hole MH provided in the stacked body 2 shown in FIGS. 2 and 3. In addition, the plate shape portion 3 is divided at the step portion 2s. Therefore, the word line is shared between adjacent fingers (that is, one block). In addition, the number of fingers in one block and the number of strings in one finger is not particularly limited and may be any numbers.

As shown in FIG. 5, the memory cell array 2m includes a cell region (Cell) and a tap region (Tap). The tap region is provided between the cell regions. The tap region may be provided, for example, between the cell region and the step region. The tap region is a region where contact plugs 37b and 37c are provided. Each of the contact plugs 37b and 37c extends, for example, in the Z-axis direction. In addition, 36b and 36c provided around the contact plugs 37b and 37c are insulating films such as a silicon oxide film. The insulating film 36b insulates between the contact plug 37b and the second conductive layer 21 of the stacked body 2 and between the contact plug 37b and the upper conductive layer 13. The insulating film 36c insulates between the contact plug 37c and the second conductive layer 21.

The contact plug 37b as a second contact penetrates the first conductive layers (BSL) 12 and 13 and is electrically connected to the lower layer wiring 11a under the first conductive layer (BSL) 12 and 13. The contact plug 37b transfers a signal between the upper layer wiring such as the bit line BL or the like on the stacked body 2 and the circuit of the base body portion 1 under the stacked body 2.

On the other hand, the contact plug 37c as a first contact is electrically connected to the lower conductive layer 12 of the first conductive layers (BSL) 12 and 13. The contact plug 37c is provided to transfer a source voltage to the first conductive layers (BSL) 12 and 13. The contact plug 37c is disposed in a vicinity of the cell region (an end portion of the tap region) so as not to be separated from the first conductive layers 12 and 13 in the cell region.

The first conductive layers 12 and 13 are left in a region R12_13 indicated by a broken line in FIG. 5. The first conductive layers 12 and 13 are provided under the cell region and the contact plug 37c. Therefore, the first conductive layers 12 and 13 are able to apply the source voltage from the contact plug 37c to the memory cell array 2m. In a region R13, the upper conductive layer 13 is left, but the lower conductive layer 12 is not provided. The contact plug 37b is provided in the region R13, and the contact plug 37b penetrates the lower conductive layer 12 and is electrically connected to the lower layer wiring 11a.

Here, the first conductive layers 12 and 13 of the region R12_13 are provided in the tap region between the contact plug 37c and the nearest cell region. In addition, the upper conductive layer 13 of the region R13 is provided in a vicinity of the contact plug 37b. However, both the first conductive layers 12 and 13 are not provided in the tap region other than the regions R12_13 and R13. Therefore, in the two cell regions on both sides of the tap region and the corresponding contact plug 37c, the first conductive layers 12 and 13 are separated (divided). That is, the first conductive layers 12 and 13 are individually separately provided (divided) under each of the contact plugs 37c, and the upper conductive layer 13 is individually separately provided (divided) in an island shape in a peripheral region of each of the contact plugs 37b. In addition, the contact plug 37b penetrates the upper conductive layer 13 and is connected to the lower layer wiring 11a under the upper conductive layer 13. Therefore, although the upper conductive layer 13 is provided in the peripheral region of the contact plug 37b, the upper conductive layer 13 is not provided under the contact plug 37b.

Since the two contact plugs 37c on both sides of the tap region supply a common source voltage to the first conductive layers 12 and 13, it is preferable that the two contact plugs 37c are electrically connected to each other. For that reason, the contact plugs 37c are electrically connected to each other through an upper layer wiring 15 provided over the stacked body 2.

In addition, when the contact plug 37b is formed, although the lower conductive layer 12 is removed, the upper conductive layer 13 is left. For that reason, it is possible to form a contact hole for the contact plug 37b in the stacked body 2 using the upper conductive layer 13 as an etching stopper. As described above, when the contact plug 37b is formed, the upper conductive layer 13 functions as an etching stopper. In addition, the upper conductive layer 13 need not be provided. Therefore, the upper conductive layer 13 is left in a peripheral region of the contact plug 37b. On the other hand, the contact hole is formed up to the upper layer conductive layer 13, and then to the lower layer wiring 11a. Therefore, the upper conductive layer 13 is not left directly under the contact plug 37b.

As described above, according to the present embodiment, the first conductive layers 12 and 13 are not provided in the region other than the regions R12_13 and R13. That is, the upper conductive layer 13 or the lower conductive layer 12 corresponding to each of the contact plugs 37b and 37c is provided so as to be individually separated in the respective regions of the contact plugs 37b and 37c. As a result, even though charges from the contact plugs 37b and 37c leak through the insulating films 36b and 36c, the charges do not leak to the other contact plugs 37b and 37c through the first conductive layers 12 and 13.

Figure 6:
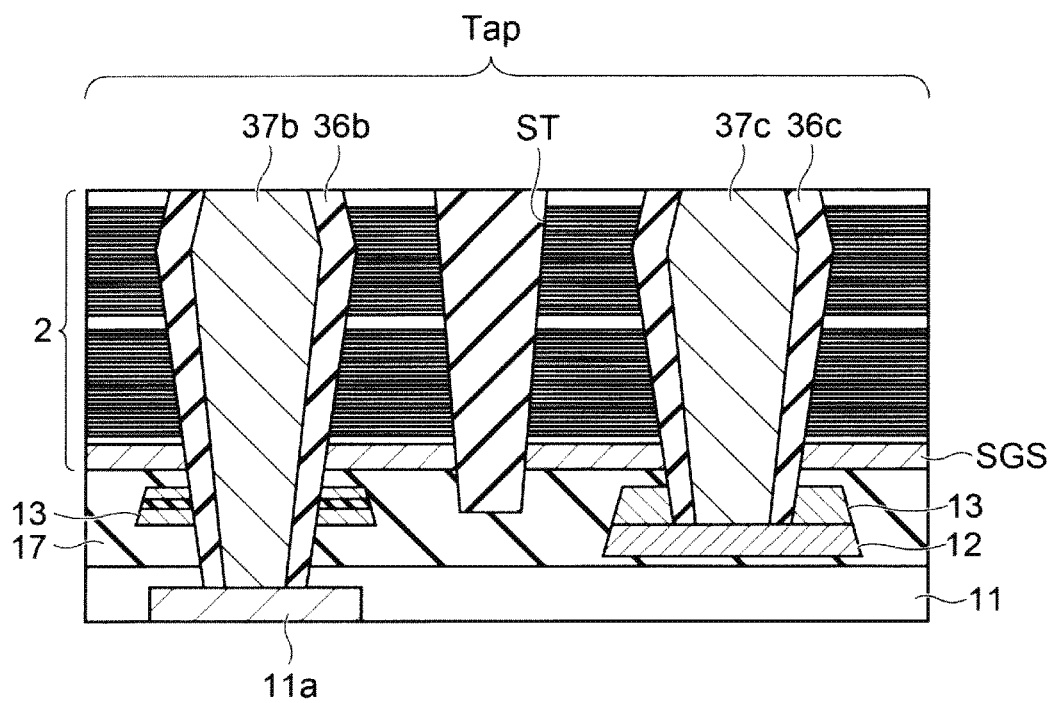
FIG. 6 illustrates a cross-sectional view of the semiconductor device taken along a line 6-6 of FIG. 5.
Figure 7:
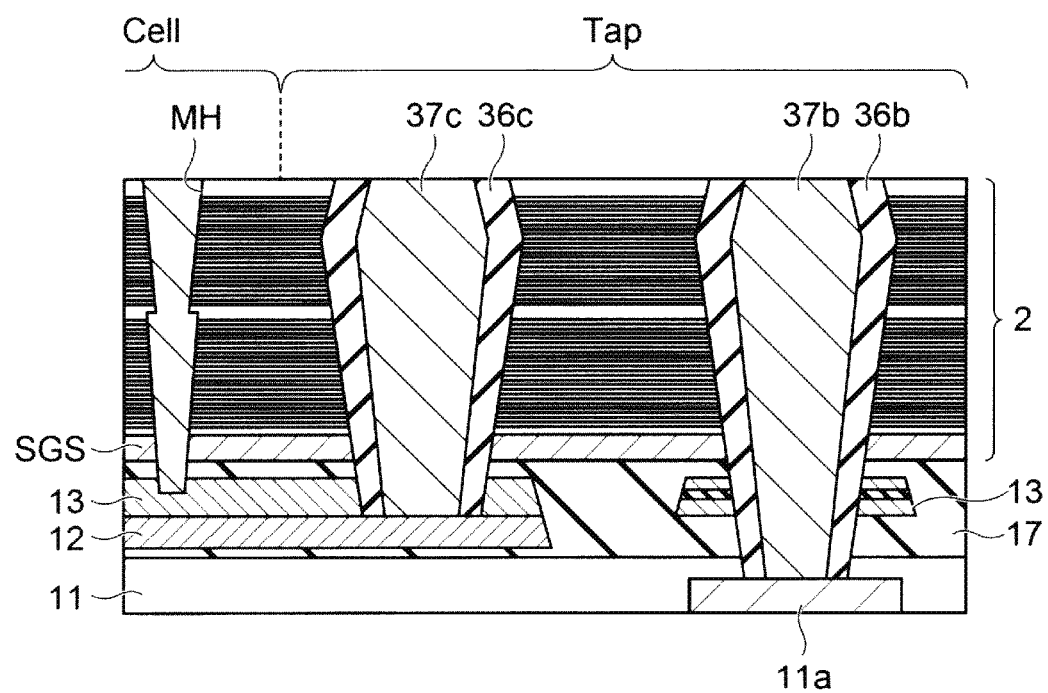
FIG. 7 illustrates a cross-sectional view of the semiconductor device taken along a line 7-7 of FIG. 5.

FIG. 6 illustrates a cross-sectional view of the semiconductor storage device 100 taken along a line 6-6 of FIG. 5. FIG. 7 illustrates a cross-sectional view of the semiconductor storage device 100 taken along a line 7-7 of FIG. 5. The contact plug 37b is connected to the lower layer wiring 11a through the stacked body 2 and the upper layer conductive layer 13. The insulating film 36b is provided around the contact plug 37b and electrically separates the contact plug 37b and the second conductive layer 21 and electrically separates the contact plug 37b and the upper conductive layer 13. The insulating film 36b may or may not be provided between the upper conductive layer 13 and the lower layer wiring 11a. The lower conductive layer 12 is not provided under or in a vicinity of the contact plug 37b. That is, in a peripheral region of the contact plug 37b, the lower conductive layer 12 is not provided under the upper conductive layer 13, and the insulating film 17 is provided. The upper conductive layer 13 functions as an etching stopper in a process of forming a contact hole. The upper conductive layer 13 may be, for example, a doped polysilicon layer or a stacked film of polysilicon and an insulating film. As described above, the contact plug 37b is connected to the lower layer wiring 1a while being insulated from the stacked body 2 and the first conductive layers 12 and 13. Therefore, the contact plug 37b is able to transfer a signal between the upper layer wiring such as the bit line BL on the stacked body 2 and the circuit of the base body portion 1 under the stacked body 2.

The contact plug 37c is connected to the lower conductive layer 12 through the stacked body 2. The contact plug 37c is electrically connected to the first conductive layers 12 and 13. The insulating film 36c is provided around the contact plug 37c and electrically separates between the contact plug 37c and the second conductive layer 21. The first conductive layers 12 and 13 are provided under or in a vicinity of the contact plug 37c. The lower conductive layer 12 may be, for example, a tungsten silicide layer or another conductive metal material layer. As described above, the contact plug 37c is electrically connected to the first conductive layers 12 and 13 while being insulated from the stacked body 2. For that reason, the contact plug 37c is able to apply the source voltage to the first conductive layers 12 and 13 and the cell region. That is, the first conductive layers 12 and 13 function as buried source lines (BSL).

Here, as described with reference to FIG. 5, the first conductive layers 12 and 13 or a part thereof are formed in the vicinity of or under the contact plugs 37b and 37c (that is, the regions R12_13 and R13) in the tap region. However, the first conductive layers 12 and 13 are not provided in the parts of the tap region other than the regions R12_13 and R13. Therefore, even though the insulating films 36b and 36c are destroyed, the charges from the contact plugs 37b and 37c do not leak to the first conductive layers 12 and 13. That is, the semiconductor storage device 100 according to the present embodiment is able to prevent short-circuit of contact plugs 37b and 37c to other contact plugs 37b and 37c through the first conductive layers 12 and 13.

In addition, the slit ST of FIG. 6 penetrates the stacked body 2 in the Z direction and is buried by the insulating film. In the memory hole MH of FIG. 7, the structures of FIGS. 2 and 3 are formed. The first columnar portion CL in the memory hole MH is connected to the first conductive layers 12 and 13 and is able to receive the source voltage from the first conductive layers 12 and 13.

Next, a method of manufacturing the semiconductor storage device 100 according to the first embodiment will be described.

Figure 8A:
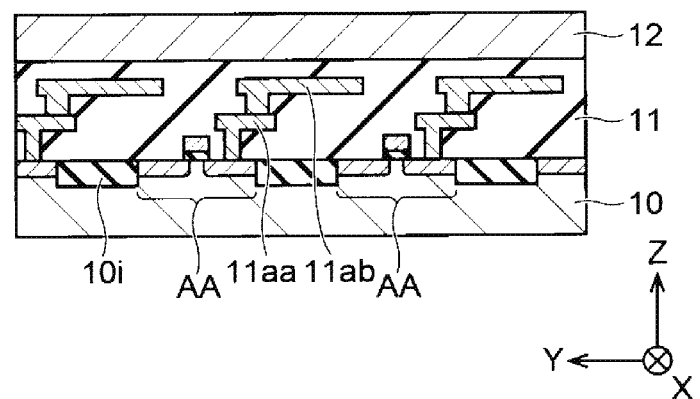
FIGS. 8A and 8B illustrate cross-sectional views of an example of a method of manufacturing the semiconductor storage device according to the first embodiment.
Figure 17A:
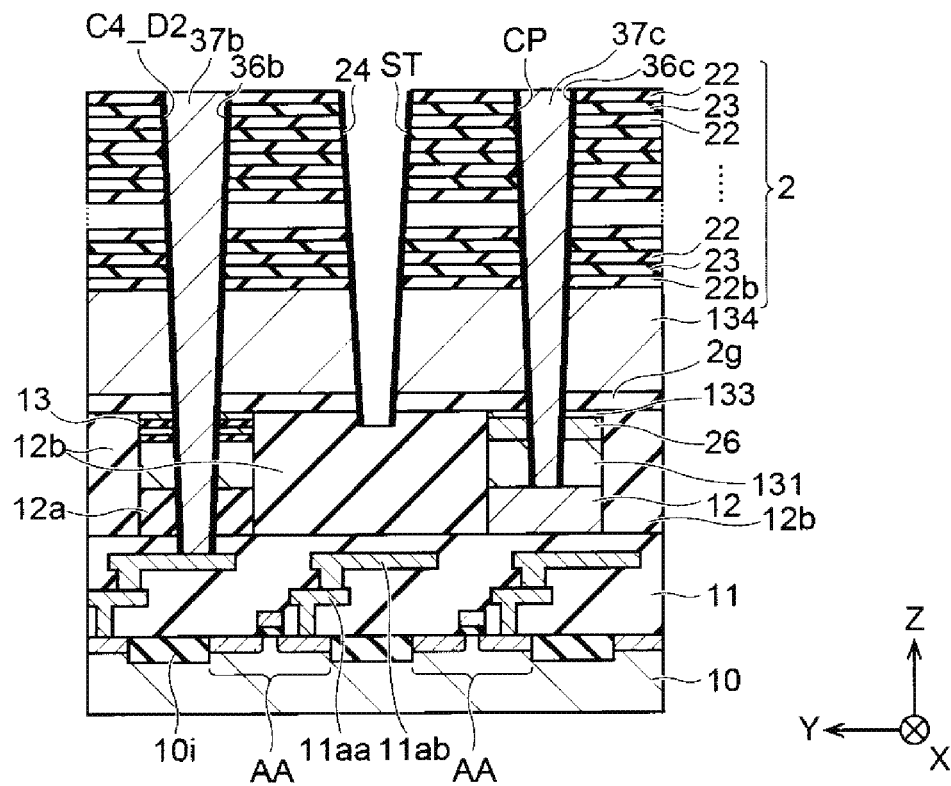
FIGS. 17A and 17B illustrate cross-sectional views of an example of the manufacturing method following FIGS. 16A and 16B.
Figure 17B:
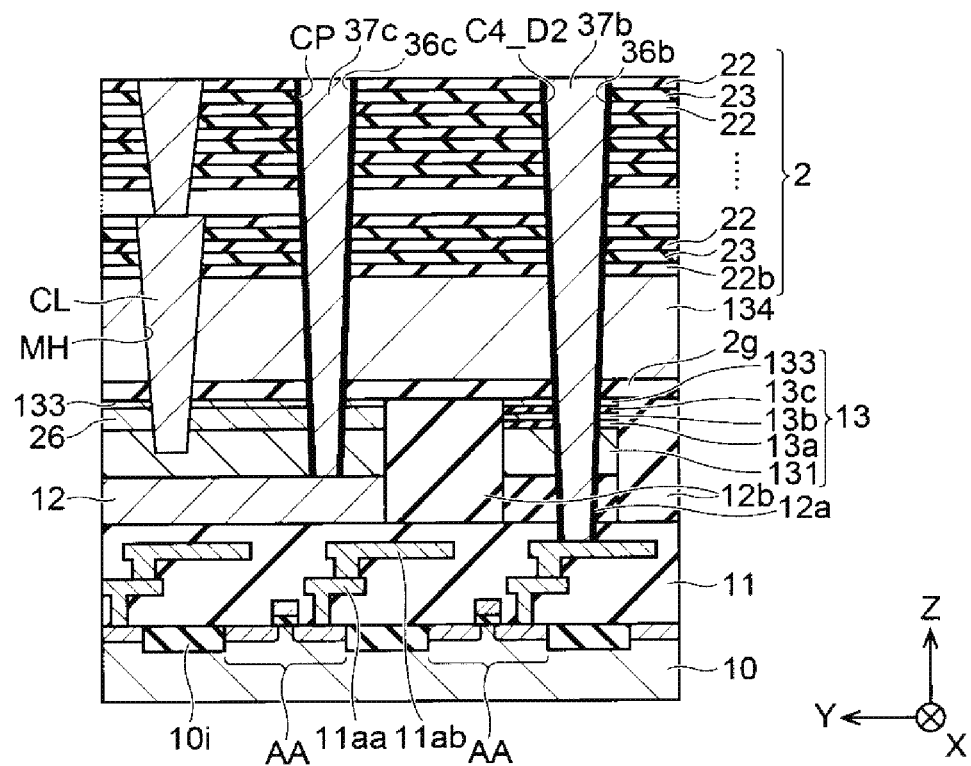
Figure 18A:
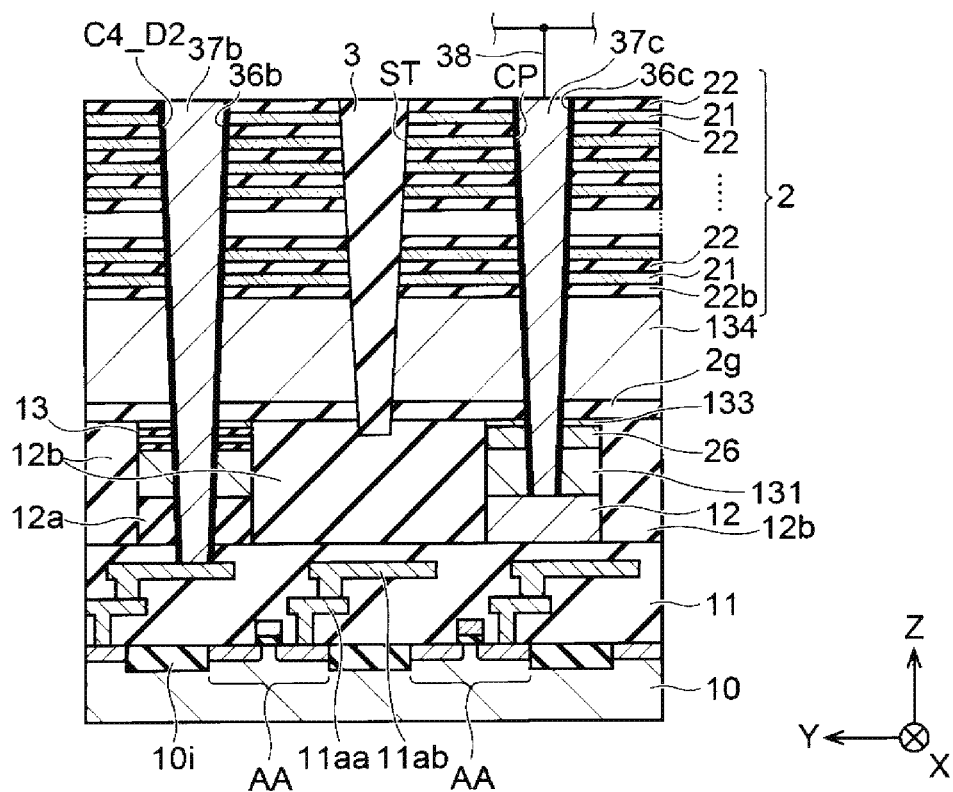
FIGS. 18A and 18B illustrate cross-sectional views of an example of the manufacturing method following FIGS. 17A and 17B.
Figure 18B:
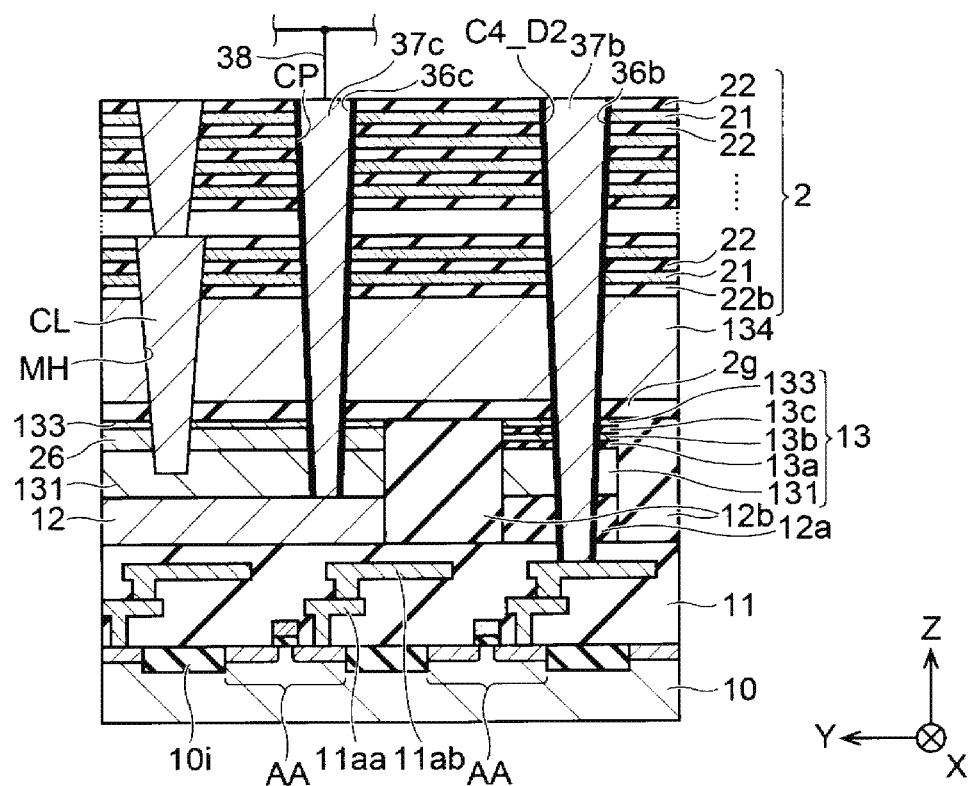

FIGS. 8A and 18B illustrate cross-sectional views an example of the method of manufacturing the semiconductor storage device 100 according to the first embodiment. Among FIGS. 8A to 18B, the figures having the letter "A" in the view numbers correspond to the cross section of FIG. 6, and the figures having the letter "B" in the view numbers correspond to the cross section of FIG. 7.

Figure 8B:
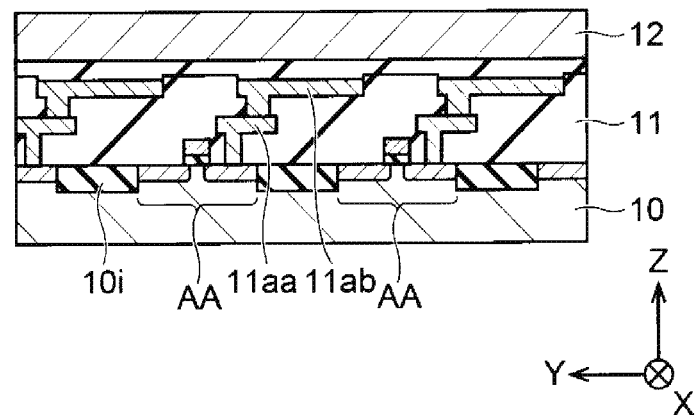

As shown in FIGS. 8A and 8B, the element isolation area 10i is formed in the substrate 10, and the transistor Tr is formed in the active area AA. Next, the first insulating film 11 is formed on the substrate 10. The first insulating film 11 is, for example, an interlayer insulating film and covers the lower layer wiring 11a. The lower layer wiring 11a is, for example, a multilayer wiring layer, and includes a wiring 11aa and a wiring 11ab provided over the wiring 11aa. Next, an insulating film 11d is formed on the wiring 11ab. The insulating film 11d includes, for example, silicon oxide. Next, the lower conductive layer 12 is formed on the insulating film 11d.

Figure 9A:
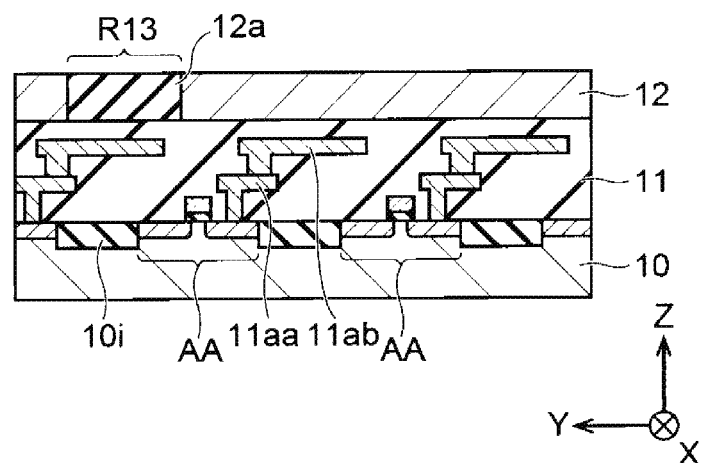
FIGS. 9A and 9B illustrate cross-sectional views of an example of the manufacturing method following FIGS. 8A and 8B.
Figure 9B:
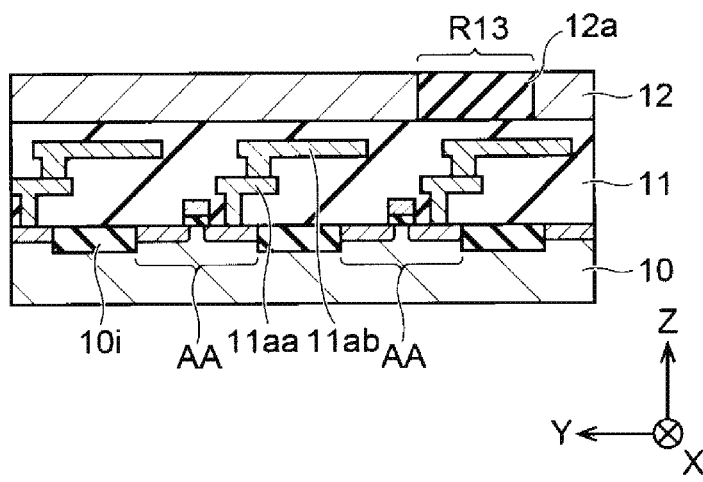

Next, the lower conductive layer 12 is processed using a lithography technique and an etching technique. The lower conductive layer 12 that is directly under the contact plug 37b and the peripheral region of the contact plug 37b of FIGS. 6 and 7 is removed. That is, the lower conductive layer 12 in the formation region (R13) of the contact plug 37b of FIG. 5 is removed. At this step, gaps in the lower conductive layer 12 are not made between the plurality of contact plugs 37c in the tap region. As shown in FIGS. 9A and 9B, an insulator 12a such as a silicon oxide film is buried in the region R13 from which the lower conductive layer 12 is removed.

Figure 10A:
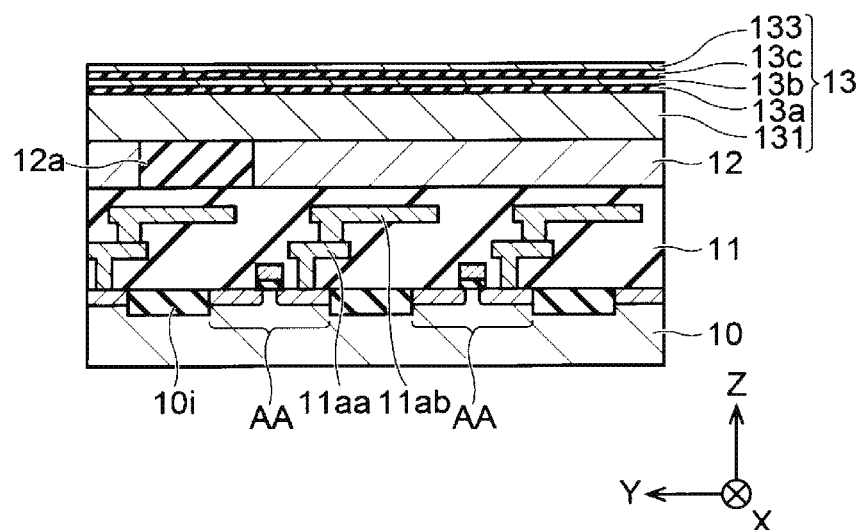
FIGS. 10A and 10B illustrate cross-sectional views of an example of the manufacturing method following FIGS. 9A and 9B.
Figure 10B:
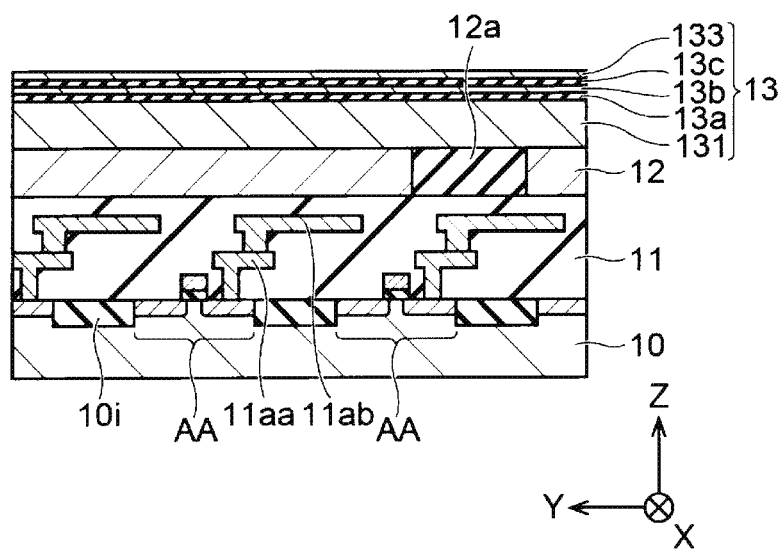

Next, as shown in FIGS. 10A and 10B, a semiconductor layer 131, an intermediate film 13a, a sacrifice film 13b, an intermediate film 13c, and a semiconductor layer 133 are sequentially deposited on the first conductive layer 12 and the insulating film 31. The semiconductor layer 131 includes, for example, n-type doped silicon. The intermediate films 13a and 13c includes, for example, silicon oxide. The sacrifice film 13b and the semiconductor layer 133 include, for example, n-type doped silicon or undoped silicon. Hereinafter, the semiconductor layer 131, the intermediate film 13a, the sacrifice film 13b, the intermediate film 13c, and the semiconductor layer 133 are also collectively referred to as the upper conductive layer 13.

Figure 11A:
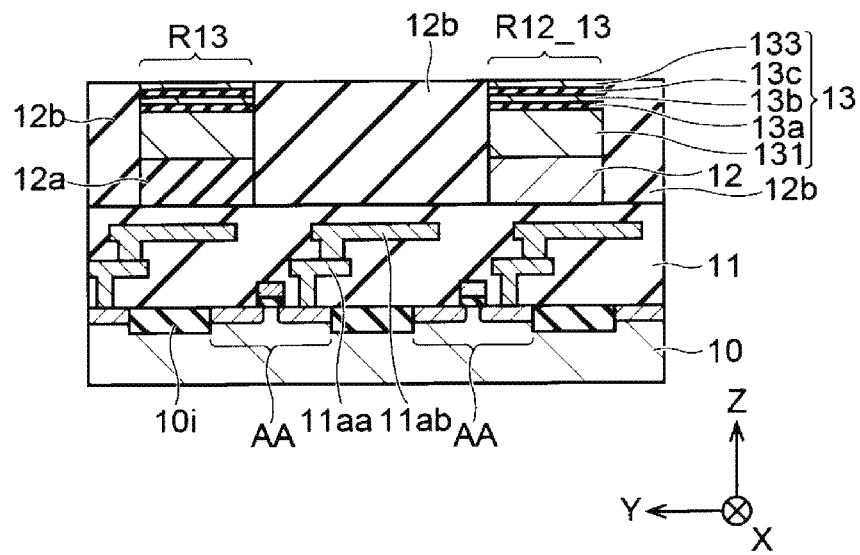
FIGS. 11A and 11B illustrate cross-sectional views of an example of the manufacturing method following FIGS. 10A and 10B.
Figure 11B:
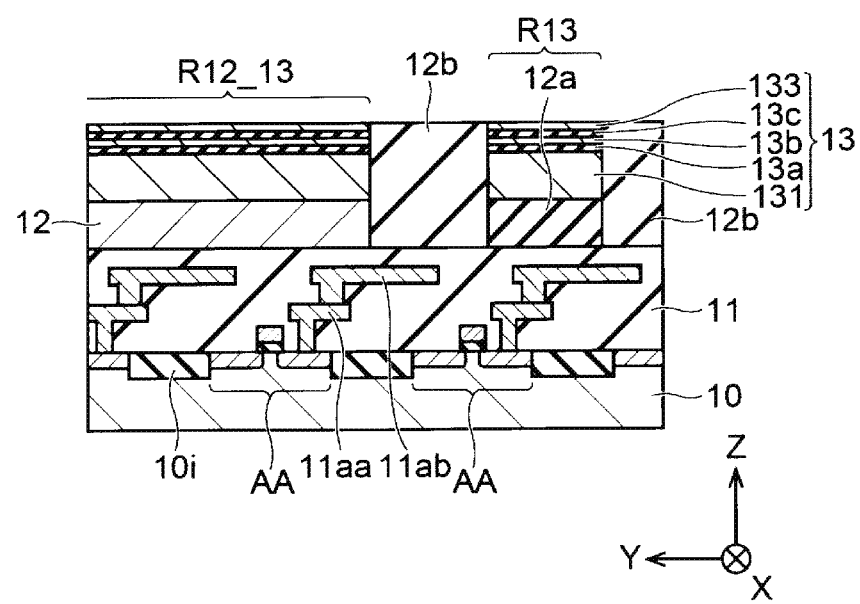

Next, as shown in FIGS. 11A and 11B, the upper conductive layer 13 and the lower conductive layer 12 are processed by a lithography technique and an etching technique. At this time, the upper conductive layer 13 and the lower conductive layer 12 are removed in the regions other than the region directly under the contact plugs 37b and 37c of FIGS. 6 and 7 and the peripheral region of the contact plugs 37b and 37c. That is, the upper conductive layer 13 and the lower conductive layer 12 in the regions other than the formation regions (R13 and R12_13) of the contact plugs 37b and 37c of FIG. 5 are removed. The lower conductive layer 12 may be processed using the upper conductive layer 13 as a mask. That is, in this process, the upper conductive layer 13 and the lower conductive layer 12 are processed with the same mask. In this etching process, the upper conductive layer 13 and the lower conductive layer 12 are removed between the plurality of contact plugs 37b and 37c in the tap region. Therefore, the contact plugs 37b and 37c are separated in the upper conductive layer 13 and the lower conductive layer 12, respectively.

In addition, in the etching step shown in FIGS. 9A and 9B, the upper conductive layer 13 is left on the region R13 from which the lower conductive layer 12 is removed. That is, in the formation region R13 of the contact plug 37b, although the lower conductive layer 12 is removed, the upper conductive layer 13 functioning as an etching stopper is left on the insulator 12a.

In addition, according to the present embodiment, it is not necessary to connect the contact plug 37c to the lower conductive layer 12 in order to connect the contact plugs 37c to the upper layer wiring 15. Therefore, the upper conductive layer 13 and the lower conductive layer 12 are able to be etched at the same time with the same mask. That is, a process of patterning only the upper conductive layer 13 is unnecessary.

Figure 12A:
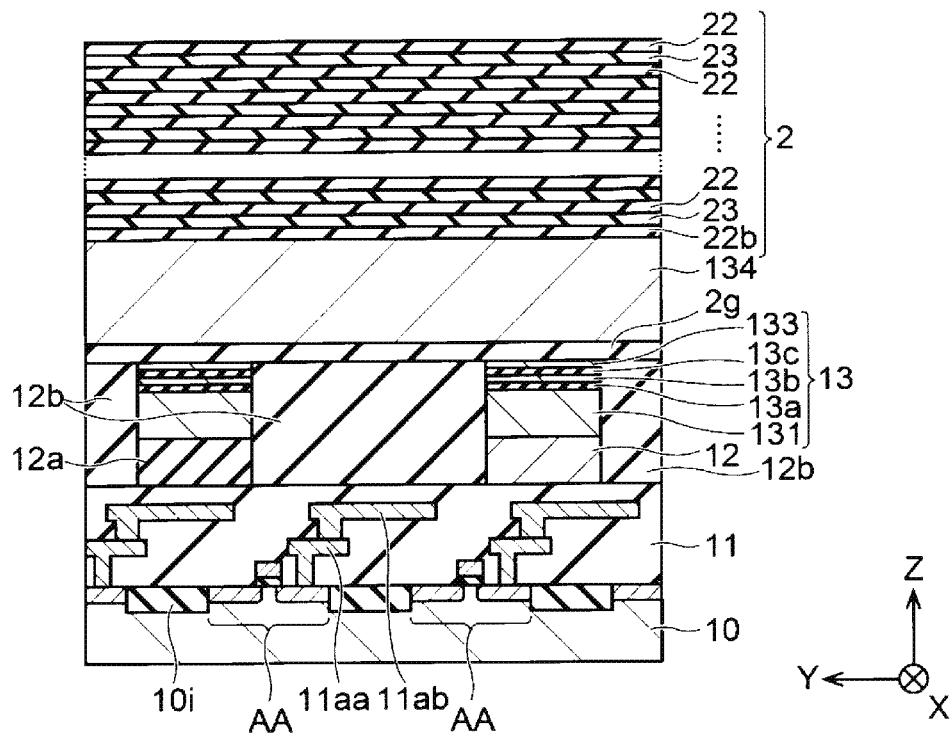
FIGS. 12A and 12B illustrate cross-sectional views of an example of the manufacturing method following FIGS. 11A and 11B.
Figure 12B:
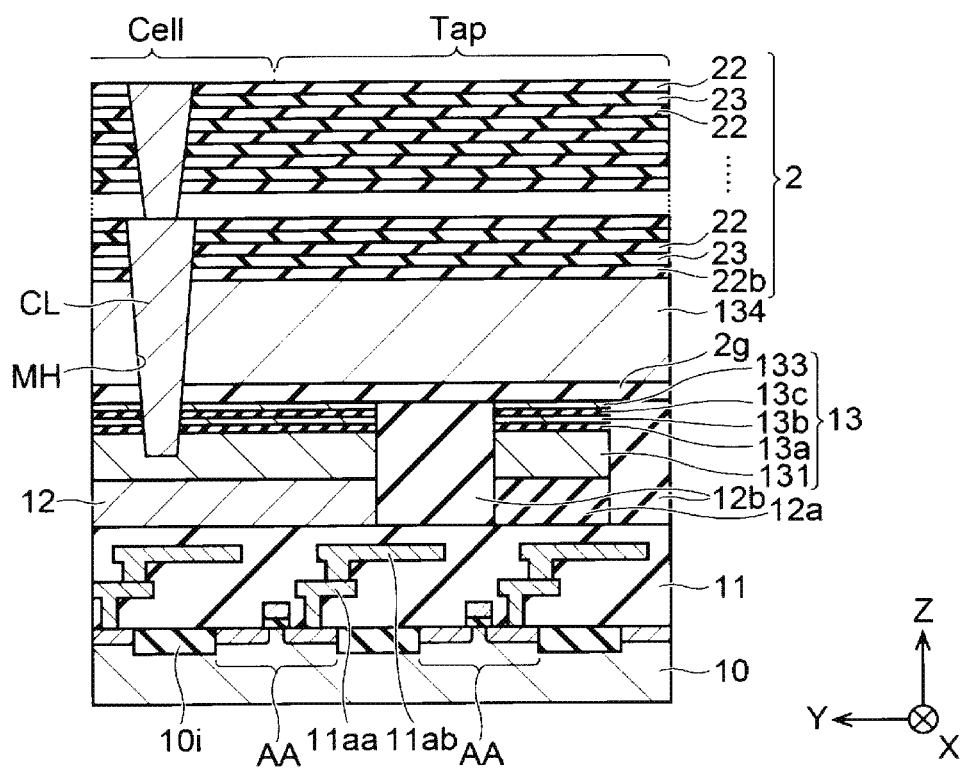

Next, as shown in FIGS. 12A and 12B, the insulating film 2g is formed on the upper conductive layer 13. The insulating film 2g includes, for example, silicon oxide or metal oxide. Next, a semiconductor layer 134 is formed on the insulating film 2g. The semiconductor layer 134 includes, for example, n-type doped silicon. The semiconductor layer 134 later serves as a gate electrode of the source-side selection gate SGS. Next, an insulating layer 22b is formed on the semiconductor layer 134. Subsequently, a sacrifice film 23 and the insulating layer 22 are alternately stacked on the insulating layer 22b. Each of the insulating layers 22 and 22b includes, for example, silicon oxide. The sacrifice film 23 includes, for example, silicon nitride. Therefore, the stacked body 2 stacked in the Z-axis direction with respect to the upper layer conductive layer 13 is obtained.

As shown in FIG. 12B, the memory hole MH is formed in the stacked body 2. When the numbers of the sacrifice films 23 and the insulating layers 22 in the stacked body 2 increase, the aspect ratio of the memory hole MH increases. Therefore, the memory hole MH and the first columnar portion CL may be formed in the lower layer portion and the upper layer portion of the stacked body 2 over the course of plural times. For example, after stacking the lower layer portion of the stacked body 2, the lower layer portion of the first columnar portion CL is formed in the stacked body 2, and furthermore, after the upper layer portion of the stacked body 2 is stacked on the lower layer portion of the stacked body 2, the upper portion of the first columnar portion CL may be formed on the upper layer portion of the stacked body 2.

When forming the upper portion of the first columnar portion CL, the memory hole MH is formed so as to reach the lower portion of the first columnar portion CL provided in the lower layer portion of the stacked body 2. Furthermore, the first columnar portion CL is formed in the memory hole MH. Therefore, the first columnar portion CL is provided in the Z direction in the stacked body 2 so as to reach from the uppermost layer of the stacked body 2 to the upper layer conductive layer 13 as a whole. The first columnar portion CL is provided in the cell region. In addition, in FIG.

12B and the following figures, illustration of the detailed configuration of the first columnar portion CL is omitted.

Figure 13A:
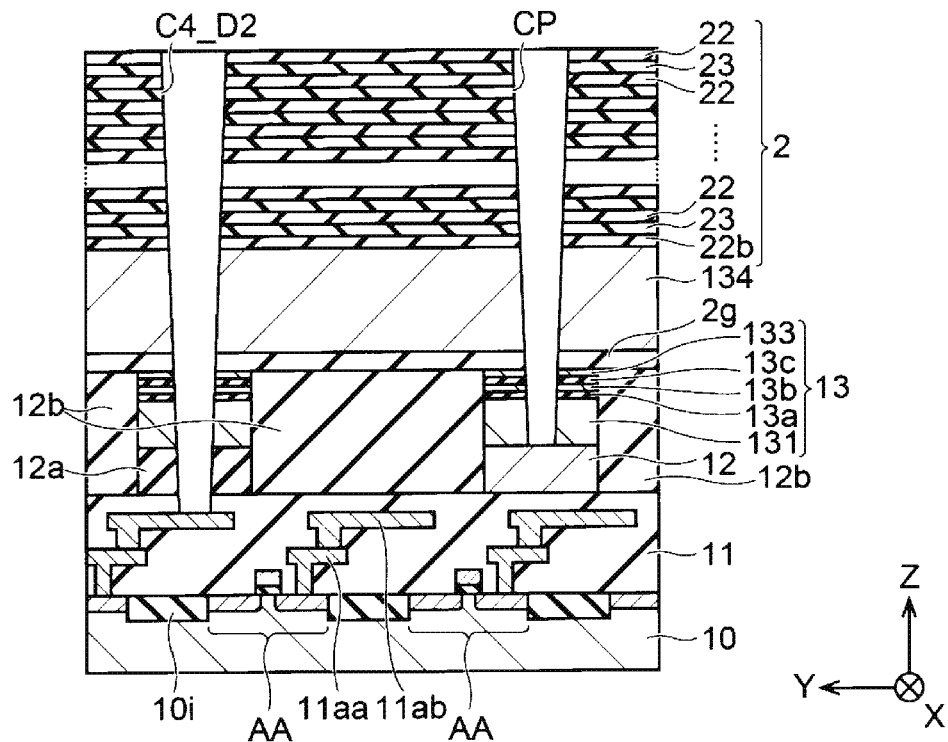
FIGS. 13A and 13B illustrate cross-sectional views of an example of the manufacturing method following FIGS. 12A and 12B.
Figure 13B:
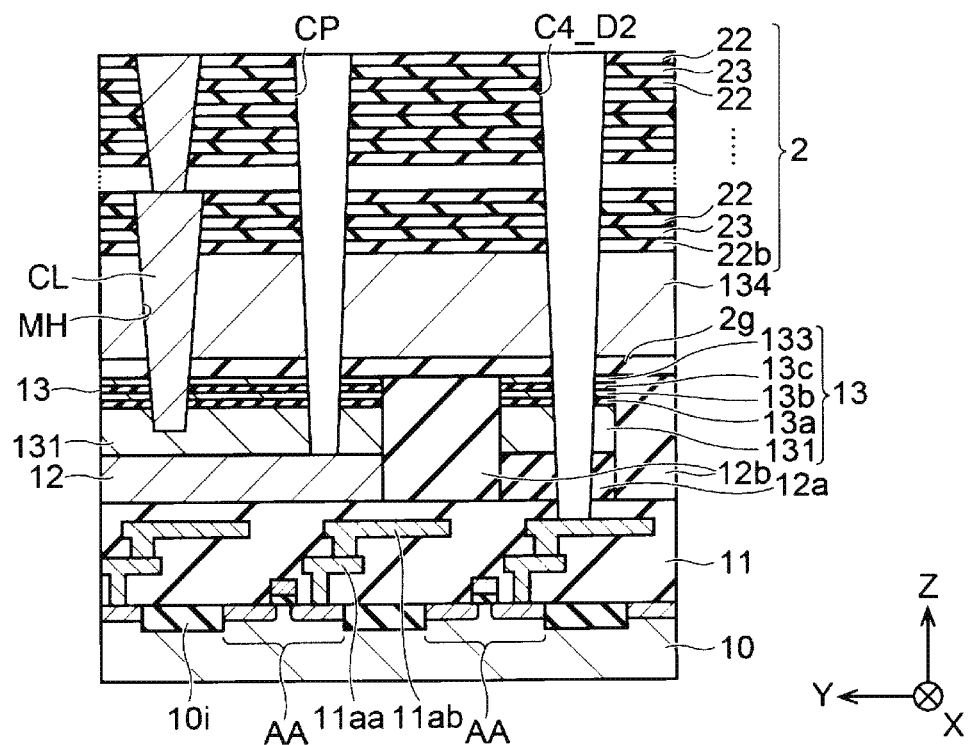

Next, as shown in FIGS. 13A and 13B, a contact hole C4_D2 is formed in the formation region of the contact plug 37b by using a lithography technique and an etching technique, and a contact hole CP is formed in the formation region of the contact plug 37c. The contact hole C4_D2 is a contact hole extending from the uppermost layer of the stacked body 2 to the lower layer wiring 11a through the upper layer conductive layer 13. The contact hole CP is a contact hole extending from the uppermost layer of the stacked body 2 to the lower conductive layer 12 through the upper conductive layer 13.

Here, when the contact hole C4_D2 is formed, the upper conductive layer 13 is left under the stacked body 2 in the formation regions of the contact plugs 37b and 37c. The upper conductive layer 13 has stacked films (133, 13a, 13b, 13c, and 131) of a silicon oxide film and polysilicon and functions as an etching stopper. Therefore, the contact hole C4_D2 is etched at a high speed from the stacked body 2 to the upper conductive layer 13, reaches the upper conductive layer 13, and then is etched at a low speed to the wiring 11ab or the lower conductive layer 12. Therefore, it is possible to form the contact holes C4_D2 and CP with a desired depth and a desired size with high accuracy. In addition, the conductive layer 13 may be omitted in the formation region of the contact plug 37b. In this case, at the time of forming the contact holes C4_D2 and CP, it is possible to perform the etching from the stacked body 2 to the wiring 11ab or the lower conductive layer 12 at a high speed. Therefore, it is possible to shorten an etching time of the contact holes C4_D2 and CP.

Figure 14A:
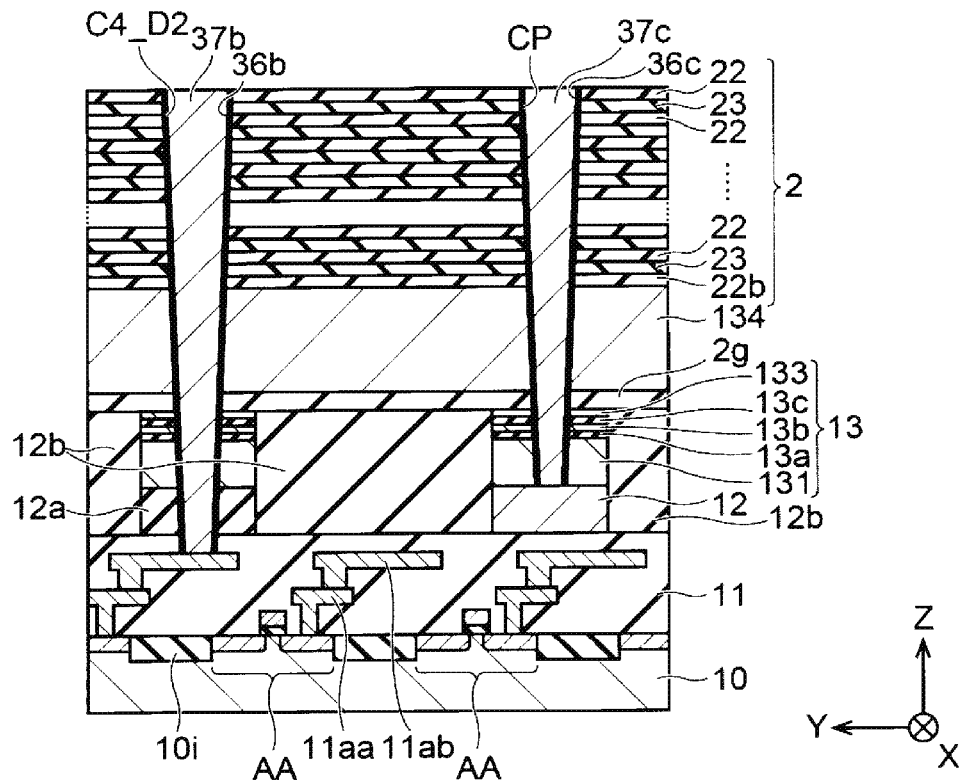
FIGS. 14A and 14B illustrate cross-sectional views of an example of the manufacturing method following FIGS. 13A and 13B.
Figure 14B:
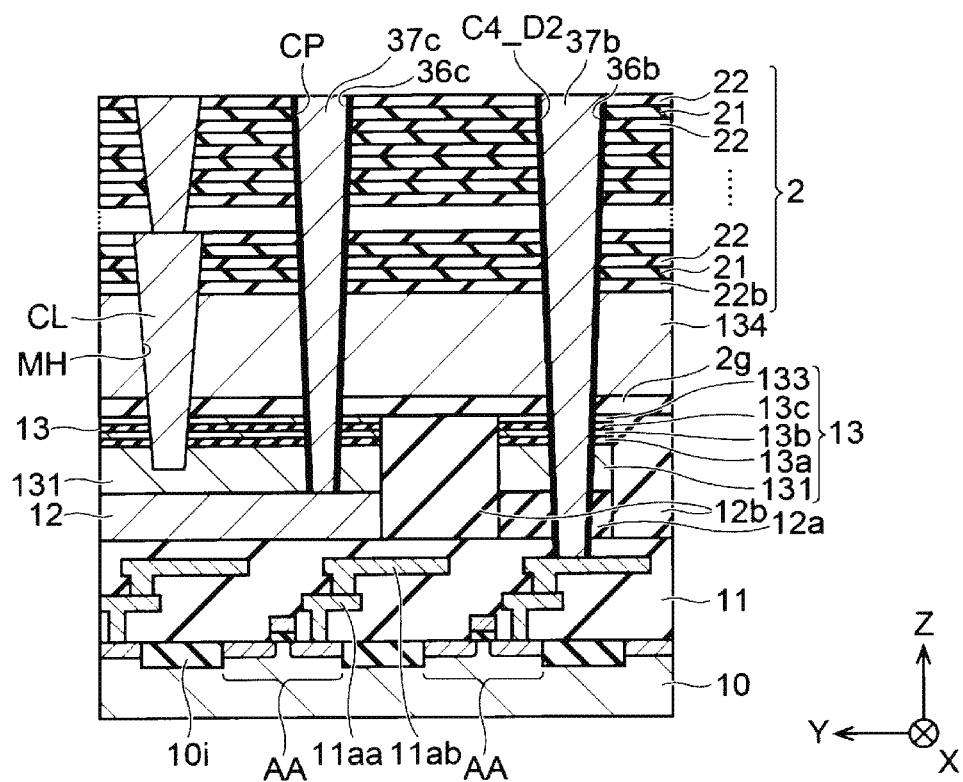

Next, as shown in FIGS. 14A and 14B, the insulating films 36b and 36c are formed on inner surfaces of the contact holes C4_D2 and CP. Furthermore, the contact plugs 37b and 37c are formed inside the contact holes C4_D2 and CP. The insulating films 36b and 36c are, for example, silicon oxide films. The contact plugs 37b and 37c may be, for example, a conductive metal such as tungsten. Therefore, the contact plug 37b is electrically connected to the wiring 11ab while being insulated from the first conductive layers 12 and 13. The contact plug 37c is electrically connected to the lower conductive layer 12 of the first conductive layers 12 and 13.

Figure 15A:
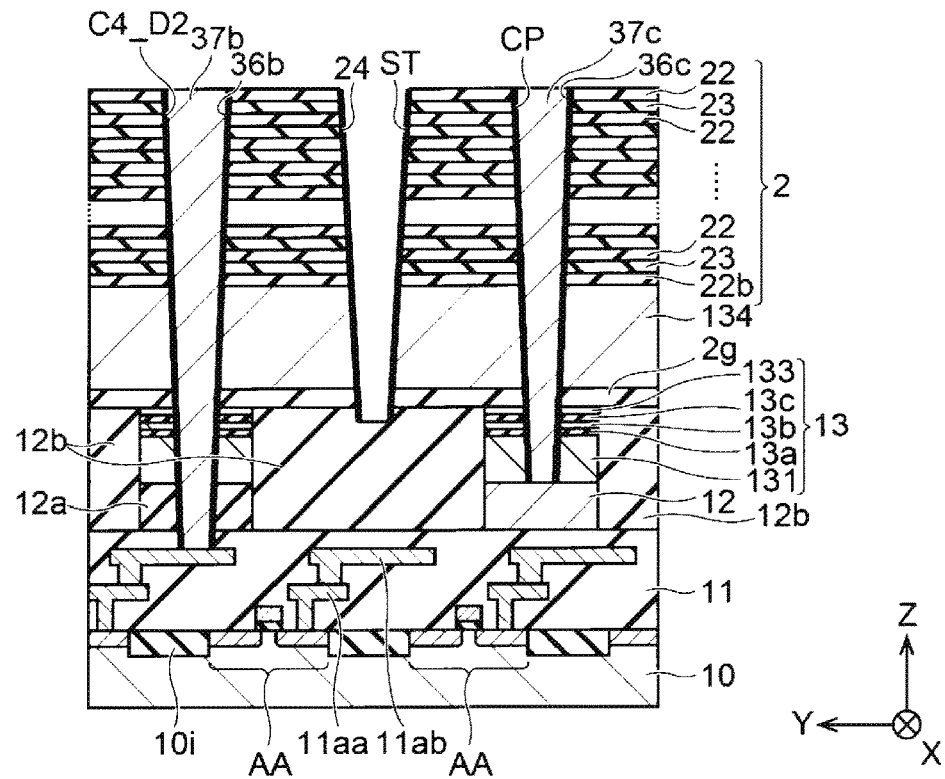
FIGS. 15A and 15B illustrate cross-sectional views of an example of the manufacturing method following FIGS. 14A and 14B.
Figure 15B:
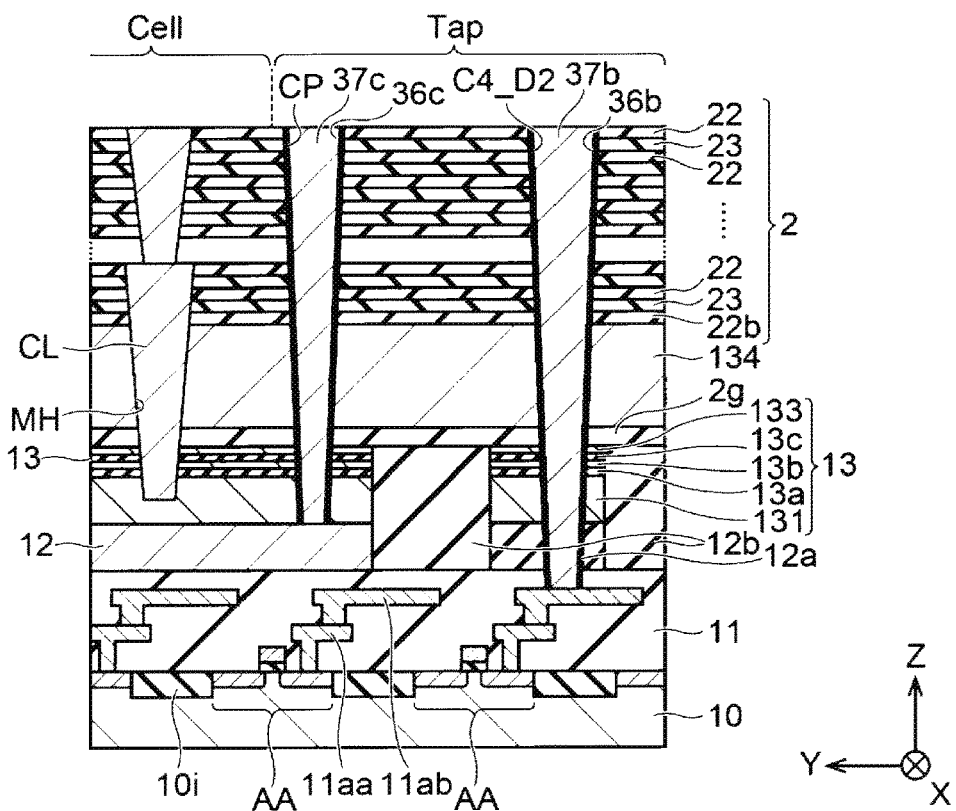

Next, the slit ST is formed as shown in FIG. 15A. The slit ST is formed so as to reach the sacrifice film 13b of the upper conductive layer 13 from the uppermost layer of the stacked body 2. In addition, in FIG. 15A, although the slit ST is on the insulating film 12b, the slit ST passes through the sacrifice film 13b in another cross section (not shown). Next, an insulating film 24 is formed on an inner surface of the slit ST. The insulating film 24 includes, for example, a silicon nitride film.

Next, the sacrifice film 13c is etched in an isotropic manner through the slit ST. At this time, when the sacrifice film 13c is, for example, polysilicon, the sacrifice film 13c is selectively etched with respect to the insulating film 24 in the slit ST. Next, although not shown, the cover insulating film 221, the charge trapping film 222, and the tunnel insulating film 223 (refer to FIGS. 2 and 3) of the first columnar portion CL are removed. At this time, the intermediate films 13a and 13c are simultaneously etched. Therefore, as shown in FIG. 16B, a cavity portion 25 is formed around the semiconductor body 210 of the first columnar portion CL.

Figure 16A:
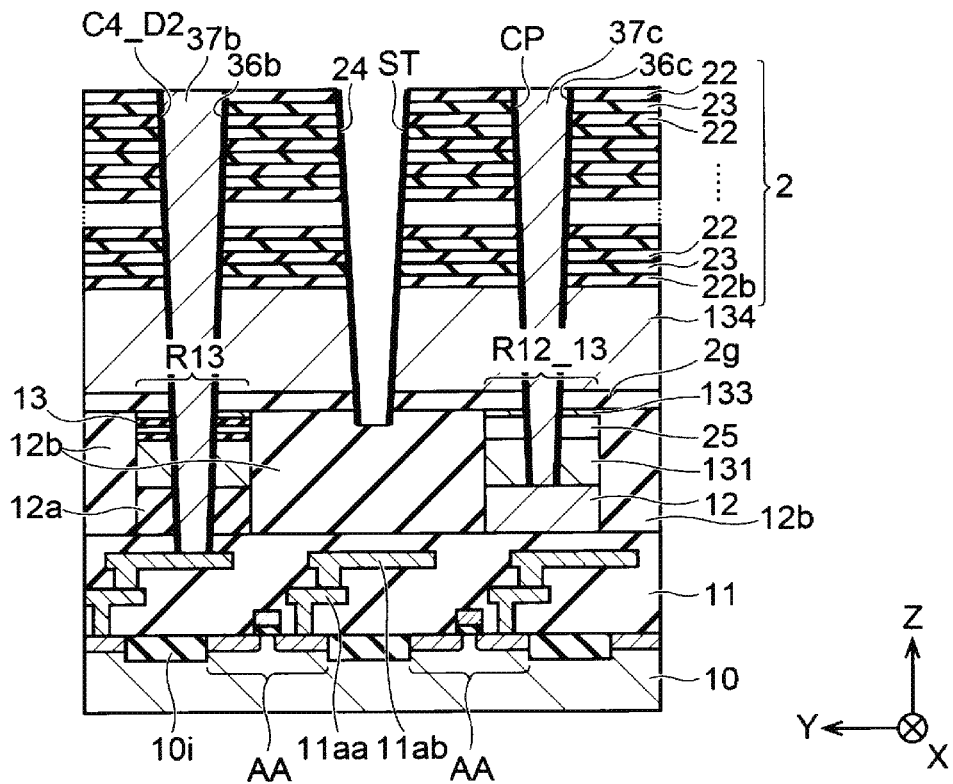
FIGS. 16A and 16B illustrate cross-sectional views of an example of the manufacturing method following FIGS. 15A and 15B.
Figure 16B:
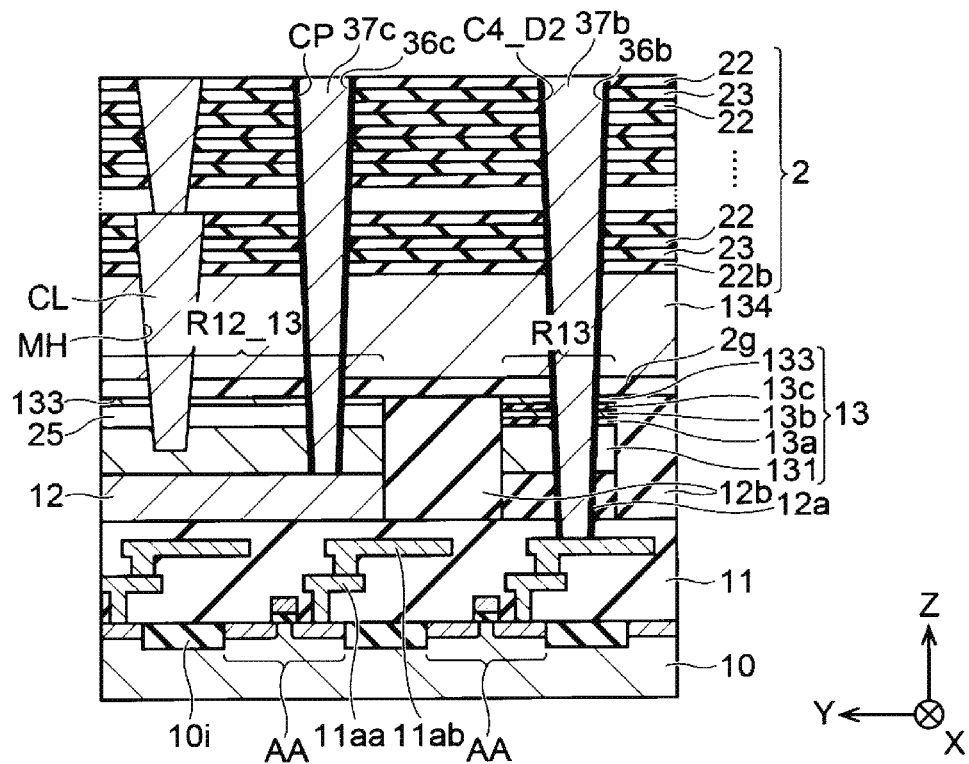

In addition, in FIGS. 16A and 16B, the intermediate films 13a and 13c and the sacrifice film 13b are left in the formation regions of the contact plugs 37b and 37c. However, the cavity portion 25 may be provided throughout the region R12_13 of FIG. 5 through the slit ST. Therefore, the intermediate films 13a and 13c and the sacrifice film 13b of the formation region of the contact plug 37c in the region R12_13 may be removed, and the cavity portion 25 may be formed.

Next, as shown in FIGS. 17A and 17B, the conductive layer 26 is buried in the cavity portion 25 through the slit ST. The conductive layer 26 is, for example, n-type doped silicon. The conductive layer 26 is electrically connected to the semiconductor body 210 of the first columnar portion CL. Therefore, the semiconductor body 210 and the first conductive layers (BSL) 12 and 13 are electrically connected to each other. As a result, the first conductive layers (BSL) 12 and 13 are able to apply the source voltage to the semiconductor body 210 which is to be the channel region of the memory cell MC.

The insulating film 24 in the slit ST is removed and the sacrifice film 23 of the stacked body 2 is etched and removed. The sacrifice film 23 is, for example, a silicon nitride film and is wet-etched with a hot phosphoric acid solution. Therefore, it is possible to selectively remove the sacrifice film 23 while leaving the insulating layer 22. Furthermore, a material (for example, tungsten) of the second conductive layer 21 is buried in a space from which the sacrifice film 23 is removed. Therefore, as shown in FIGS. 18A and 18B, the sacrifice film 23 of the stacked body 2 is replaced with the second conductive layer 21.

Next, the slit ST is filled with an insulating film such as a silicon oxide film and the plate shape portion 3 is formed.

Next, a multilayer wiring layer is formed on the stacked body 2. Therefore, the structures shown in FIGS. 18A and 18B are obtained. Here, as described with reference to FIG. 5, the first conductive layers 12 and 13 are individually separated in the region R12_13 of the contact plug 37c. Since the contact plugs 37c are contacts for transferring the common source voltage, it is necessary to connect the contact plugs 37c to each other. Therefore, in the present embodiment, the plurality of contact plugs 37c is connected to each other by the upper layer wiring 15. The upper layer wiring 15 is a wiring formed over the stacked body 2 and is electrically connected to the contact plug 37c through an upper layer contact 38.

Thereafter, bit line BL and the like are formed, and thus the semiconductor storage device 100 shown in FIG. 1 is completed.

According to the present embodiment, the first conductive layers 12 and 13 of the region R12_13 of FIG. 5 extend to the tap region between the contact plug 37c and the nearest cell region. In addition, the upper conductive layer 13 of the region R13 is provided in the vicinity of each contact plug 37b. On the other hand, the first conductive layers 12 and 13 are not provided in portions of the tap region other than the regions R12_13 and R13. Therefore, the two cell regions on both sides of the tap region and the first conductive layers 12 and 13 of the region R12_13 of the contact plug 37c corresponding thereto are separated (divided) from each other. In addition, the upper conductive layer 13 are separated (divided) so as to provide an island shape in the peripheral region of each contact plug 37b. Therefore, the contact plugs 37b and 37c are not short-circuited to the other contact plug 37b or 37c through the first conductive layers 12 and 13. Thus, the semiconductor storage device 100 according to the present embodiment is able to prevent leakage of the charges from the contact plugs 37b and 37c.

In addition, since the upper layer wiring 15 connects the contact plugs 37c to each other, it is not necessary to connect the contact plugs 37c to each other by the lower conductive layer 12, and the upper conductive layer 13 and the lower conductive layer 12 are able to be etched at the same time by the same mask. Therefore, the process of patterning only the upper conductive layer 13 is unnecessary.

In addition, when forming the contact plugs 37b and 37c, the upper conductive layer 13 is left. Therefore, the upper conductive layer 13 functions as an etching stopper when forming the contact plugs 37b and 37c.

Modified Example

In the lower conductive layer 12 according to the first embodiment, for example, a metal silicide such as tungsten silicide or a metal material is used. On the other hand, in the lower conductive layer 12 according to a modified example, similarly to the semiconductor layer 131 of the upper conductive layer 13, a semiconductor material is used. For example, n-type doped silicon is used for the lower conductive layer 12. That is, the lower conductive layer 12 serve as a semiconductor layer integrated with the semiconductor layer 131 of the upper conductive layer 13. As described above, in the lower conductive layer 12, doped polysilicon may also be used instead of metal silicide or metal material. Even in this case, the effect of the present embodiment is able to be obtained in the modified example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a base body including a substrate, a semiconductor element on the substrate, a lower wiring layer above the semiconductor element in a thickness direction of the base body and connected to the semiconductor element, and a lower conductive layer above the lower wiring layer in the thickness direction;
   a stacked body above the lower conductive layer and including an alternating stack of a plurality of conductive layers and a plurality of insulating layers that are alternately stacked;
   a plurality of columns, each of the columns including a semiconductor body extending through the stacked body in a stack direction of the stacked body and electrically connected to the lower conductive layer, and a memory film having a charge trapping portion between the plurality of conductive layers and the semiconductor body; and
   a plurality of first contacts extending through the stacked body into the base body in the stack direction and electrically connected to the lower conductive layer,
   wherein the lower conductive layer is separately provided under each of the plurality of first contacts.

2. The semiconductor storage device according to claim 1, wherein
   the plurality of columns are in a cell region of the stacked body, and
   the plurality of first contacts are in a tap region of the stacked body.

3. The semiconductor storage device according to claim 1, wherein the plurality of first contacts are on separate portions of the lower conductive layer, respectively.

4. The semiconductor storage device according to claim 1, further comprising:
   a plurality of second contacts extending through the stacked body into the base body in the stack direction and electrically connected to the lower wiring layer,
   wherein the lower conductive layer is not provided around the second contacts.

5. The semiconductor storage device according to claim 4, further comprising:
   an upper conductive layer on the lower conductive layer, wherein
   the plurality of first contacts and the plurality of second contacts extend through the upper conductive layer, and
   the upper conductive layer is separately provided under each of the plurality of first contacts and each of the plurality of second contacts.

6. The semiconductor storage device according to claim 5, wherein
   the upper conductive layer is a doped polysilicon layer, and
   the lower conductive layer is a metal layer or a metal silicide layer.

7. The semiconductor storage device according to claim 5, wherein
   the upper conductive layer and the lower conductive layer are doped polysilicon layers.

8. The semiconductor storage device according to claim 4, wherein
   the plurality of columns are in a cell region of the stacked body, and
   the plurality of first contacts and the plurality of second contacts are in a tap region of the stacked body.

9. The semiconductor storage device according to claim 4, further comprising:
   an upper wiring layer above the stacked body and electrically connecting the plurality of second contacts to each other.

10. The semiconductor storage device according to claim 4, wherein the plurality of second contacts are on the lower wiring layer.

11. A semiconductor storage device comprising:
   a base body including a substrate, a semiconductor element on the substrate, a lower wiring layer above the semiconductor element in a thickness direction of the base body and connected to the semiconductor element, and an upper conductive layer above the lower wiring layer in the thickness direction;
   a stacked body above the upper conductive layer and including an alternating stack of a plurality of conductive layers and a plurality of insulating layers that are alternately stacked;
   a plurality of columns, each of the columns including a semiconductor body extending through the stacked body in a stack direction of the stacked body and electrically connected to the upper conductive layer, and a memory film having a charge trapping portion between the plurality of conductive layers and the semiconductor body; and
   a plurality of first contacts extending through the stacked body into the base body in the stack direction and extending through the upper conductive layer, the upper conductive layer being not in contact with the plurality of first contacts,
wherein the upper conductive layer is separately provided around each of the plurality of first contacts.

12. The semiconductor storage device according to claim 11, wherein
the plurality of columns are in a cell region of the stacked body, and
the plurality of first contacts are in a tap region of the stacked body.

13. The semiconductor storage device according to claim 11, wherein an insulating film is between the upper conductive layer and each of the plurality of first contacts.

14. The semiconductor storage device according to claim 11, further comprising:
a plurality of second contacts extending through the stacked body into the base body in the stack direction and through the upper conductive layer, and electrically connected to the lower wiring layer.

15. The semiconductor storage device according to claim 14, further comprising:
a lower conductive layer below the upper conductive layer, wherein
the lower conductive layer is separately provided under each of the plurality of first contacts, and not provided around each of the plurality of second contacts.

16. The semiconductor storage device according to claim 15, wherein
the upper conductive layer is a doped polysilicon layer, and
the lower conductive layer is a metal layer or a metal silicide layer.

17. The semiconductor storage device according to claim 15, wherein
the upper conductive layer and the lower conductive layer are doped polysilicon layers.

18. The semiconductor storage device according to claim 14, wherein
the plurality of columns are in a cell region of the stacked body, and
the plurality of first contacts and the plurality of second contacts are in a tap region of the stacked body.

19. The semiconductor storage device according to claim 14, further comprising:
an upper wiring layer above the stacked body and electrically connecting the plurality of second contacts to each other.

20. The semiconductor storage device according to claim 14, wherein the plurality of second contacts are on the lower wiring layer.

* * * * *